United States Patent
Chung

(10) Patent No.: US 10,535,666 B2
(45) Date of Patent: Jan. 14, 2020

(54) INTEGRATED CIRCUIT DEVICES INCLUDING FIN SHAPES

(71) Applicant: Samsung Electronics Co., Ltd., Suwon-si, Gyeonggi-do (KR)

(72) Inventor: Jae-yup Chung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 15/866,039

(22) Filed: Jan. 9, 2018

(65) Prior Publication Data
US 2018/0130808 A1    May 10, 2018

Related U.S. Application Data

(63) Continuation of application No. 14/969,778, filed on Dec. 15, 2015, now Pat. No. 9,899,393.

(30) Foreign Application Priority Data

Mar. 3, 2015  (KR) .................. 10-2015-0029864

(51) Int. Cl.
*H01L 27/11*    (2006.01)
*H01L 27/02*    (2006.01)
*H01L 29/06*    (2006.01)
*H01L 29/78*    (2006.01)

(52) U.S. Cl.
CPC ...... *H01L 27/1104* (2013.01); *H01L 27/0207* (2013.01); *H01L 29/0649* (2013.01); *H01L 29/0657* (2013.01); *H01L 29/7851* (2013.01); *H01L 29/7854* (2013.01)

(58) Field of Classification Search
CPC ............ H01L 27/0207; H01L 27/1104; H01L 29/0649; H01L 29/0657; H01L 29/7851; H01L 29/7854
USPC ........................................................ 257/392
See application file for complete search history.

(56) References Cited

U.S. PATENT DOCUMENTS

| | | |
|---|---|---|
| 7,851,276 B2 | 12/2010 | Yang et al. |
| 7,872,310 B2 | 1/2011 | Abadeer et al. |
| 7,960,287 B2 | 6/2011 | Johnson et al. |
| 8,315,084 B2 | 11/2012 | Liaw et al. |
| 8,399,931 B2 | 3/2013 | Liaw et al. |
| 8,436,405 B2 | 5/2013 | Liaw |
| 8,582,352 B2 | 11/2013 | Liaw |
| 8,653,630 B2 | 2/2014 | Liaw et al. |
| 8,675,397 B2 | 3/2014 | Liaw |
| 8,742,508 B2 | 6/2014 | Cheng et al. |
| 8,748,989 B2 | 6/2014 | Lin et al. |
| 8,779,528 B2 | 7/2014 | Liaw |
| 8,830,732 B2 | 9/2014 | Liaw |

(Continued)

FOREIGN PATENT DOCUMENTS

| | | |
|---|---|---|
| JP | 2007-149942 A | 6/2007 |
| KR | 10-1385719 B1 | 4/2014 |

(Continued)

*Primary Examiner* — Dzung Tran
(74) *Attorney, Agent, or Firm* — Myers Bigel, P.A.

(57) ABSTRACT

Integrated circuit devices are provided. An integrated circuit device includes a substrate having first and second fin-shaped Field Effect Transistor (FinFET) bodies protruding from the substrate. The first and second FinFET bodies have different respective first and second shapes in a first region and a second region, respectively, of the integrated circuit device.

19 Claims, 19 Drawing Sheets

(56) References Cited

U.S. PATENT DOCUMENTS

| | | |
|---|---|---|
| 8,859,372 B2 | 10/2014 | Liaw |
| 8,942,030 B2 | 1/2015 | Liaw |
| 8,964,455 B2 | 2/2015 | Liaw |
| 8,964,457 B2 | 2/2015 | Liaw |
| 8,987,831 B2 | 3/2015 | Liaw |
| 9,054,219 B1 * | 6/2015 | Hoffmann ....... H01L 21/823431 |
| 2007/0170474 A1 | 7/2007 | Kawasaki |
| 2008/0105932 A1 | 5/2008 | Liaw |
| 2008/0157225 A1 | 7/2008 | Datta et al. |
| 2011/0121406 A1 | 5/2011 | Lee et al. |
| 2013/0244392 A1 * | 9/2013 | Oh .................... H01L 29/66477 |
| | | 438/299 |
| 2013/0292777 A1 | 11/2013 | Liaw |
| 2014/0206181 A1 | 7/2014 | Cheng et al. |
| 2014/0367795 A1 | 12/2014 | Cai et al. |
| 2015/0132903 A1 | 5/2015 | Liaw |
| 2015/0171093 A1 | 6/2015 | Liaw |

FOREIGN PATENT DOCUMENTS

| | | |
|---|---|---|
| KR | 10-2014-0074873 A | 6/2014 |
| KR | 10-2014-0101258 A | 8/2014 |
| KR | 10-1442353 51 | 9/2014 |
| KR | 10-1445033 B1 | 9/2014 |
| KR | 10-1459220 B1 | 11/2014 |
| KR | 10-1461799 B1 | 11/2014 |
| WO | WO 2005020325 A1 | 3/2005 |

* cited by examiner

7C – 7C'

INTEGRATED CIRCUIT DEVICES INCLUDING FIN SHAPES

CROSS-REFERENCE TO RELATED APPLICATION

This application is a continuation application of and claims priority from U.S. patent application Ser. No. 14/969,778, filed on Dec. 15, 2015, which claims the benefit of Korean Patent Application No. 10-2015-0029864, filed on Mar. 3, 2015, in the Korean Intellectual Property Office, the entire content of each of the above applications is incorporated by reference herein.

BACKGROUND

The present disclosure relates to integrated circuit devices. With advances in electronics technology, semiconductor devices have scaled down rapidly. Because semiconductor devices may benefit from not only a fast operation speed but also operation accuracy, research into optimization of a structure of a transistor included in a semiconductor device has been conducted. In particular, proposals have included using a scaling technology of increasing the density of integrated circuit devices by using a multi-gate transistor that has a fin-shaped active area on a substrate and a gate on the fin-shaped active area.

SUMMARY

Example embodiments of present inventive concepts may provide an integrated circuit device having a structure capable of effectively controlling a leakage current and increasing performance of a multi-gate transistor in a highly-scaled integrated circuit device.

According to example embodiments of present inventive concepts, an integrated circuit device is provided. The integrated circuit device may include a substrate having a logic area and a memory area. The integrated circuit device may include a first fin-shaped active area in the logic area, the first fin-shaped active area having a first top portion protruding a first distance from a surface of the substrate in a direction. Moreover, the integrated circuit device may include a second fin-shaped active area in the memory area, the second fin-shaped active area having a second top portion protruding a second distance from the surface of the substrate in the direction. The second distance may be longer than the first distance.

In various embodiments, a first width of the second top portion may be narrower than a second width of the first top portion. In some embodiments, the first fin-shaped active area may include a first tip active area having a first curvature radius and having a first rounded outer surface. Moreover, the second fin-shaped active area may include a second tip active area having a second curvature radius that is less than or equal to the first curvature radius and having a second rounded outer surface.

According to various embodiments, the first top portion may include a first lower section active area having a first inclined sidewall extending at a first inclination angle with respect to the direction. The first top portion may include a first middle section active area protruding from the first lower section active area in the direction and having a second inclined sidewall extending at a second inclination angle with respect to the direction. The second inclination angle may be smaller than the first inclination angle. The first top portion may include a first upper section active area protruding from the first middle section active area in the direction and having a third inclined sidewall extending at a third inclination angle with respect to the direction. The third inclination angle may be greater than the second inclination angle. Moreover, the first top portion may include a first tip active area protruding from the first upper section active area in the direction and having a first rounded outer surface.

In various embodiments, the second top portion may include a second lower section active area having a fourth inclined sidewall extending at a fourth inclination angle greater than the first inclination angle with respect to the direction. The second top portion may include a second middle section active area protruding from the second lower section active area in the direction and having a sidewall extending at a fifth inclination angle smaller than the fourth inclination angle with respect to the direction. The second top portion may include a second upper section active area protruding from the second middle section active area in the direction and having a fifth inclined sidewall extending at a sixth inclination angle greater than the fifth inclination angle with respect to the direction. Moreover, the second top portion may include a second tip active area protruding from the second upper section active area in the direction and having a second rounded outer surface.

According to various embodiments, a first thickness of the second lower section active area in the direction may be thicker than a second thickness of the first lower section active area in the direction. Additionally or alternatively, a first thickness of the second middle section active area in the direction may be thicker than a second thickness of the first middle section active area in the direction. In some embodiments, a first width of the second middle section active area may be narrower than a second width of the first middle section active area. Additionally or alternatively, a first height of the second upper section active area may be higher than a second height of the first upper section active area. Moreover, a first width of the second upper section active area may be narrower than a second width of the first upper section active area.

In various embodiments, the first rounded outer surface of the first tip active area may have a first curvature radius, and the second rounded outer surface of the second tip active area may have a second curvature radius that is shorter than or equal to the first curvature radius. Moreover, the memory area may be a Static Random Access Memory (SRAM) area.

An integrated circuit device, according to various embodiments, may include a substrate having a first area and a second area. The integrated circuit device may include a pair of first fin-shaped active areas extending in parallel to each other in the first area and spaced apart by a first distance. Each of the pair of first fin-shaped active areas may have a first top portion protruding from the substrate in a direction. The integrated circuit device may include a pair of second fin-shaped active areas extending in parallel to each other in the second area and spaced apart by a second distance longer than the first distance. Each of the pair of second fin-shaped active areas may have a second top portion protruding from the substrate in the direction. Moreover, a first height of one of the pair of second fin-shaped active areas is higher than a second height of one of the pair of first fin-shaped active areas.

In various embodiments, the integrated circuit device may include first and second device isolation films in the first and second areas, respectively, of the substrate. The integrated circuit device may include first and second gate lines on the first and second device isolation films, respectively. The first device isolation film may be on sidewalls of a first base portion of each of the pair of first fin-shaped active areas. The first gate line may be on sidewalls of a first top portion of each of the pair of first fin-shaped active areas. The first top portion may have the second height. The second device isolation film may be on sidewalls of a second base portion of each of the pair of second fin-shaped active areas. The second gate line may be on sidewalls of a second top portion of each of the pair of second fin-shaped active areas. Moreover, the second top portion may have the first height that is higher than the second height of the first top portion. In some embodiments, a first width of the second top portion may be narrower than a second width of the first top portion.

An integrated circuit device, according to various embodiments, may include a substrate having a first area and a second area. The integrated circuit device may include a first device isolation film on the first area of the substrate. The integrated circuit device may include a second device isolation film on the second area of the substrate. The integrated circuit device may include a plurality of first fin-shaped active areas spaced apart at a constant pitch in the first area. Each of the first fin-shaped active areas may include a first top portion protruding from the first device isolation film by a first distance in a direction. Moreover, the integrated circuit device may include a plurality of second fin-shaped active areas spaced apart at variable pitches in the second area. Each of the second fin-shaped active areas may have a second top portion protruding from a second device isolation film in the direction by a second distance longer than the first distance.

In various embodiments, a first width of the second top portion may be narrower than a second width of the first top portion. In some embodiments, the first top portion may include a first lower section active area having a first inclined sidewall extending at a first inclination angle with respect to the direction. The first top portion may include a first middle section active area protruding from the first lower section active area in the direction and having a second inclined sidewall extending at a second inclination angle smaller than the first inclination angle with respect to the direction. The first top portion may include a first upper section active area protruding from the first middle section active area in the direction and having a third inclined sidewall extending at a third inclination angle greater than the second inclination angle with respect to the direction. Moreover, the first top portion may include a first tip active area protruding from the first upper section active area in the direction and having a first rounded outer surface.

According to various embodiments, the second top portion may include a second lower section active area having a fourth inclined sidewall extending at a fourth inclination angle greater than the first inclination angle with respect to the direction. The second top portion may include a second middle section active area protruding from the second lower section active area in the direction and having a sidewall extending at a fifth inclination angle smaller than the fourth inclination angle with respect to the direction. The second middle section active area may have a first width narrower than a second width of the first middle section active area. The second top portion may include a second upper section active area protruding from the second middle section active area in the direction and having a fifth inclined side wall extending at a sixth inclination angle greater than the fifth inclination angle with respect to the direction. Moreover, the second top portion may include a second tip active area protruding from the second upper section active area in the direction and having a second rounded outer surface.

In various embodiments, the first top portion may include a first tip active area having a first rounded outer surface and a first curvature radius. Moreover, the second top portion may include a second tip active area having a second rounded outer surface and a second curvature radius that is equal to or smaller than the first curvature radius.

An integrated circuit device, according to various embodiments, may include a substrate having a logic area and a memory area. The integrated circuit device may include first and second device isolation films on the logic and memory areas, respectively, of the substrate. The integrated circuit device may include first and second gate lines on the first and second device isolation films, respectively. The integrated circuit device may include a first fin-shaped active area protruding from the logic area in a direction. The first fin-shaped active area may include a first base portion having a sidewall having the first device isolation film thereon. Moreover, the first fin-shaped active area may include a first top portion protruding from the first base portion in the direction and having the first gate line thereon. The integrated circuit device may include a second fin-shaped active area protruding from the memory area in the direction. The second fin-shaped active area may include a second base portion having a sidewall having the second device isolation film thereon. Moreover, the second fin-shaped active area may include a second top portion protruding from the second base portion in the direction. The second top portion may have the second gate line thereon and may have a first height higher than a second height of the first top portion.

In various embodiments, a first width of the second top portion may be narrower than a second width of the first top portion. In some embodiments, the first top portion may include a first tip active area having a first rounded outer surface having a first curvature radius. Moreover, the second top portion may include a second tip active area having a second rounded outer surface having a second curvature radius shorter than the first curvature radius. In some embodiments, the first top portion may include a first lower section active area having a first inclined sidewall extending at a first inclination angle with respect to the direction. Moreover, the second top portion may include a second lower section active area having a second inclined sidewall extending at a second inclination angle greater than the first inclination angle with respect to the direction.

According to various embodiments, the first top portion may include a first middle section active area protruding from the first lower section active area in the direction and having a third inclined sidewall extending at a third inclination angle smaller than the first inclination angle with respect to the direction. The second top portion may include a second middle section active area protruding from the second lower section active area in the direction and having a sidewall extending parallel to the direction.

An integrated circuit device, according to various embodiments, may include a substrate having first and second fin-shaped Field Effect Transistor (FinFET) bodies protruding from the substrate. The first and second FinFET bodies may have different respective first and second shapes in a logic region and a memory region, respectively, of the integrated circuit device. In some embodiments, the second FinFET body in the memory region may be narrower and taller than the first FinFET body in the logic region. For example, the second FinFET body in the memory region may be 1-5 nanometers (nm) taller than the first FinFET body in the logic region, and the second FinFET body in the memory region may be at least 1 nm narrower than the first FinFET body in the logic region.

In various embodiments, the first and second FinFET bodies may be included among first and second pluralities of FinFET bodies in the logic region and the memory region, respectively. Adjacent ones of the first plurality of FinFET bodies in the logic region may be spaced apart from each other by a first distance. Adjacent ones of the second plurality of FinFET bodies in the memory region may be spaced apart from each other by a second distance that is longer than the first distance. Moreover, the first FinFET body may be included among a first plurality of FinFET bodies spaced apart from each other with a fixed pitch in the logic region, and the second FinFET body may be included among a second plurality of FinFET bodies spaced apart from each other with a variable pitch in the memory region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
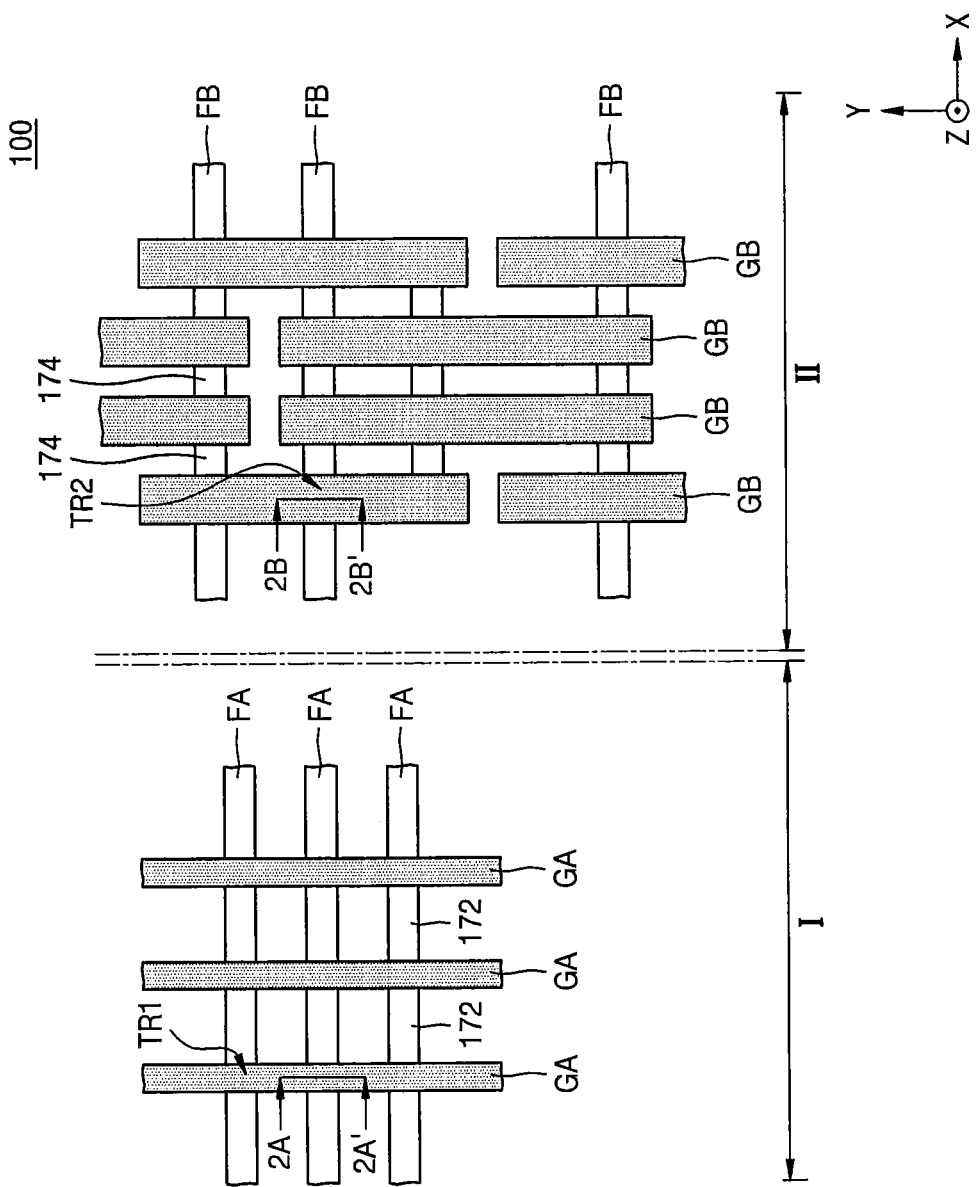
FIG. 1 is a plan layout diagram of an integrated circuit device, according to some example embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan layout diagram of an integrated circuit device 100, according to example embodiments of present inventive concepts.

Referring to FIG. 1, the integrated circuit device 100 may include a first area I and a second area II. In some embodiments, the first and second areas I, II may be referred to as first and second regions, respectively, of the integrated circuit device 100.

The first area I and the second area II may be connected to each other or may be spaced apart from each other. In some embodiments, the first area I and the second area II may perform the same function. Additionally or alternatively, the first area I and the second area II may perform different functions. For example, the first area I may be a part of a logic area, and the second area II may be another part of the logic area. As another example, the first area I may be one area selected from a memory area and a non-memory area, and the second area II may be another area selected from the memory area and the non-memory area. For example, the memory area may include a Static Random Access Memory (SRAM) area, a Dynamic Random Access Memory (DRAM) area, a Magnetic/Magnetoresistive Random Access Memory (MRAM) area, a Resistive Random Access Memory (RRAM) area, or a Phase-Change Random Access Memory (PRAM) area, and the non-memory area may include the logic area. However, the memory area and the non-memory area are not limited thereto. As an example, the first area I may be the logic area (e.g., a logic region), and the second area II may be the SRAM area (e.g., a memory/SRAM region).

The first area I of the integrated circuit device 100 may include a plurality of first fin-shaped active areas FA extending in parallel to each other at an invariable (e.g., constant/fixed) pitch and a plurality of first gates GA extending in a direction across (e.g., perpendicular to) the plurality of first fin-shaped active areas FA on the plurality of first fin-shaped active areas FA. A first fin-shaped transistor TR1 may be formed in each of a plurality of portions/regions in which the plurality of first fin-shaped active areas FA and the plurality of first gates GA cross/intersect each other.

The second area II of the integrated circuit device 100 may include a plurality of second fin-shaped active areas FB extending in parallel to each other and a plurality of second gates GB extending in a direction across (e.g., perpendicular to) the plurality of second fin-shaped active areas FB on the plurality of second fin-shaped active areas FB. The plurality of second fin-shaped active areas FB may be formed at variable pitches so that a distance between a first pair of adjacent spaced-apart second fin-shaped active areas FB may be different from a distance between a second pair of adjacent spaced-apart second fin-shaped active areas FB.

A second fin-shaped transistor TR2 may be formed in portions/regions in which the plurality of second fin-shaped active areas FB and the plurality of second gates GB cross/intersect each other.

The plurality of first fin-shaped active areas FA and the plurality of second fin-shaped active areas FB are illustrated in the first area I and the second area II, respectively, but present inventive concepts are not limited thereto. For example, one or more fin-shaped active areas may be formed in each of the first area I and the second area II, and the number of the one or more fin-shaped active areas is not particularly limited thereto. Moreover, in some embodiments, the first and second fin-shaped active areas FA, FB may be referred to as fin-shaped Field Effect Transistor (FinFET) bodies. For example, the first fin-shaped active areas FA may be FinFET bodies in a logic region (e.g., the first area I) of the integrated circuit device 100, and the second fin-shaped active areas FB may be FinFET bodies in a memory region (e.g., the second area II) of the integrated circuit device 100.

Figure 2:
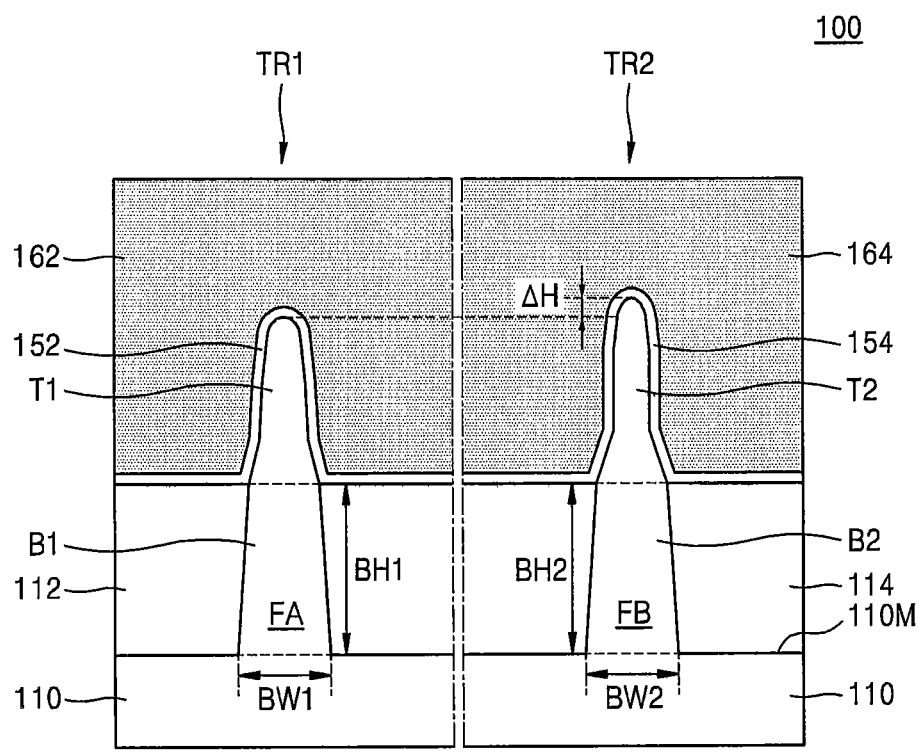
FIG. 2 is a cross-sectional view of an integrated circuit device taken along a line 2A-2A' and a line 2B-2B' of FIG. 1.

FIG. 2 is a cross-sectional view of an integrated circuit device taken along a line 2A-2A' and a line 2B-2B' of FIG. 1.

Although a particular first fin-shaped active area FA among the plurality of first fin-shaped active areas FA formed in the first area I and a particular second fin-shaped active area FB among the plurality of second fin-shaped active areas FB formed in the second area II are illustrated in FIG. 2, detailed descriptions of the particular first fin-shaped active area FA and the particular second fin-shaped active area FB that will be described with reference to FIG. 2 may apply to any of the plurality of first fin-shaped active areas FA and any of the plurality of second fin-shaped active areas FB illustrated in FIG. 1.

Referring to FIGS. 1 and 2, the first fin-shaped active area FA formed in the first area I of the integrated circuit device 100 may protrude from a substrate 110 in a first direction (Z direction) perpendicular to a main surface 110M of the substrate 110. The first fin-shaped active area FA may extend longest/primarily in a second direction (X direction) perpendicular to the first direction (Z direction) on the substrate 110. The first fin-shaped active area FA may include a first base portion B1 having side walls covered by a first device isolation film 112 and a first top portion T1 extending in the first direction (Z direction) from the first base portion B1 and protruding from/beyond the first device isolation film 112.

The second fin-shaped active area FB formed in the second area II of the integrated circuit device 100 may protrude from the substrate 110 in the first direction (Z direction) perpendicular to the main surface 110M of the substrate 110. The second fin-shaped active area FB may include a second base portion B2 having side walls covered by a second device isolation film 114 and a second top portion T2 extending in the first direction (Z direction) from the second base portion B2 and protruding from/beyond the second device isolation film 114.

A height of the second fin-shaped active area FB formed in the second area II may be greater (e.g., farther from the main surface 110M) than that of the first fin-shaped active area FA formed in the first area I. A difference ΔH between the height of the second fin-shaped active area FB and the height of the first fin-shaped active area FA may be in a range from about 1~about 5 nanometers (nm) but is not limited thereto.

The substrate 110 may include a semiconductor such as Silicon (Si) or Germanium (Ge) or a compound semiconductor such as Silicon Germanium (SiGe), Silicon Carbide (SiC), Gallium Arsenide (GaAs), Indium Arsenide (InAs), or Indium Phosphide (InP). As another example, the substrate 110 may have a silicon on insulator (SOI) structure. The substrate 110 may include a conductive area, for example, an impurity-doped well or an impurity-doped structure. The plurality of first fin-shaped active areas FA and the plurality of second fin-shaped active areas FB may be obtained/formed by etching portions of the substrate 110 and may be formed of the same material as that of the substrate 110.

Each of the first and second device isolation films 112 and 114 may include an oxide film, a nitride film, or a combination of these.

The first base portion B1 of the first fin-shaped active area FA formed in the first area I and the second base portion B2 of the second fin-shaped active area FB formed in the second area II may have approximately the same shape. For example, a width BW1 of a bottom surface of the first base portion B1 of the first fin-shaped active area FA formed in the first area I and a width BW2 of a bottom surface of the second base portion B2 of the second fin-shaped active area FB formed in the second area II may be the same or substantially/approximately the same. A height BH1 of the first base portion B1 of the first fin-shaped active area FA formed in the first area I and a height BH2 of the second base portion B2 of the second fin-shaped active area FB formed in the second area II may be the same or substantially/approximately the same.

Figure 3A:
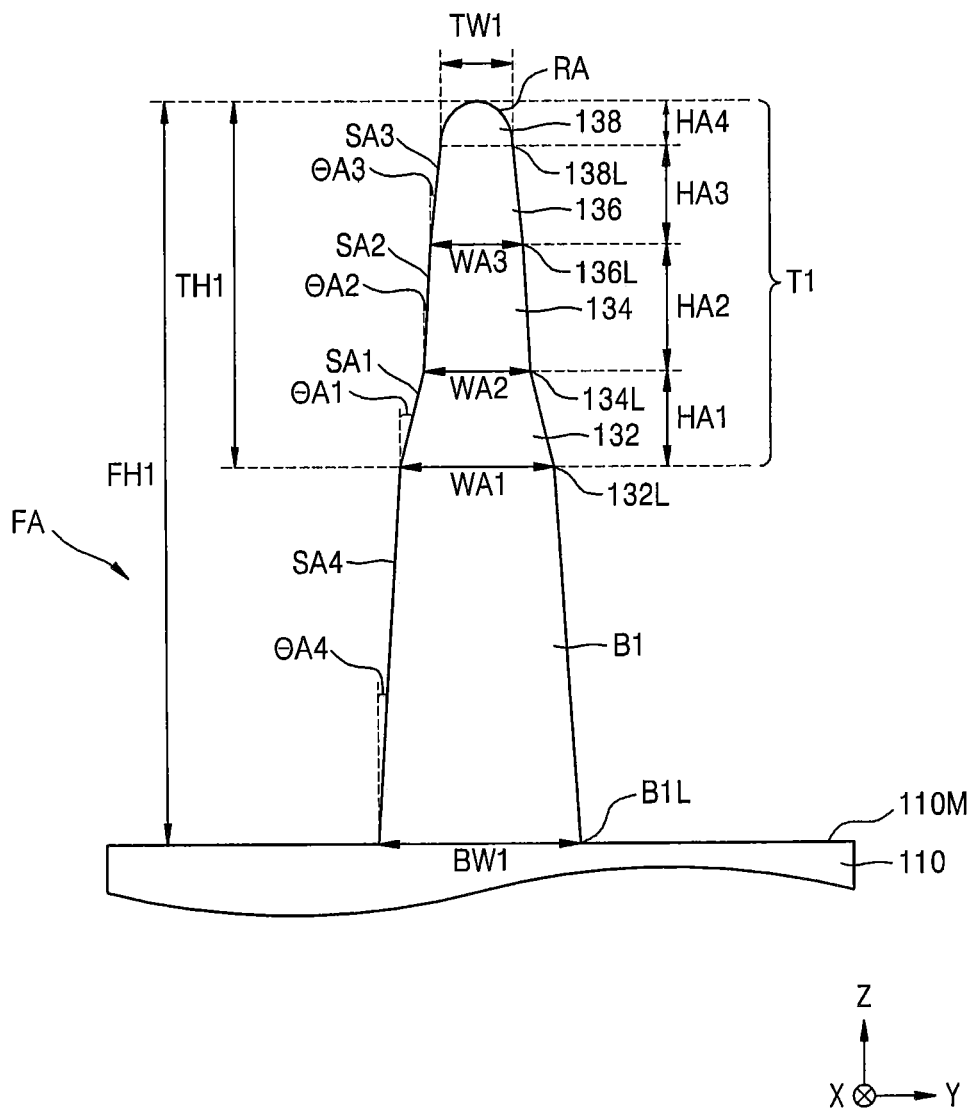
FIG. 3A is an enlarged cross-sectional view for describing in more detail a first fin-shaped active area of an integrated circuit device, according to some example embodiments of present inventive concepts.

FIG. 3A is an enlarged cross-sectional view for describing in more detail the first fin-shaped active area FA described with reference to FIGS. 1 and 2, according to example embodiments of present inventive concepts.

A single/individual first fin-shaped active area FA among the plurality of first fin-shaped active areas FA is illustrated in FIG. 3A. A detailed description of the first fin-shaped active area FA that will be described with reference to FIG. 3A may apply to any of the plurality of first fin-shaped active areas FA illustrated in FIG. 1.

Referring to FIG. 3A, the first top portion T1 of the first fin-shaped active area FA formed in the first area I may include a first lower section active area 132, a first middle section active area 134, a first upper section active area 136, and a first tip active area 138 that are sequentially disposed/positioned from the first base portion B1 in the first direction (Z direction) and are integrally connected to each other.

The first lower section active area 132 may protrude from the first base portion B1 in the first direction (Z direction) and have a first inclined side wall SA1 extending to have a first inclination angle θA1. In this regard, an "inclination angle" in the first area I means an angle formed by a surface perpendicular to the main surface 110M of the substrate 110 and extending in the same direction as a direction in which the first fin-shaped active area FA extends, for example, an X-Z plane, and a side wall of the first fin-shaped active area FA. The first lower section active area 132 may have a first height HA1.

The first middle section active area 134 may protrude from the first lower section active area 132 in the first direction (Z direction) and have a second inclined side wall SA2 extending to have a second inclination angle θA2 smaller than the first inclination angle θA1. The first middle section active area 134 may have a second height HA2. In some embodiments, the second height HA2 of the first middle section active area 134 may be greater than the first height HA1 of the first lower section active area 132 (HA1<HA2).

The first upper section active area 136 may protrude from the first middle section active area 134 in the first direction (Z direction) and have a third side wall SA3 extending to have a third inclination angle θA3 larger than the second inclination angle θA2. The first upper section active area 136 may have a third height HA3. In some embodiments, the third height HA3 of the first upper section active area 136 may be smaller than the second height HA2.

The first tip active area 138 may protrude from the first upper section active area 136 in the first direction (Z direction) and have a rounded outer surface RA. The first tip active area 138 may have a fourth height HA4. The rounded outer surface RA of the first tip active area 138 may have a predetermined curvature radius determined according to a first tip width TW1 and the fourth height HA4 of the first tip active area 138.

In some embodiments, the second inclined side walls SA2 may extend from the first lower section active area 132 at a second inclination angle θA2 that is equal to or greater than 0 degrees and is selected from a range of values smaller than the first inclination angle θA1 in the first middle section active area 134 (0°≤θA2<θA1). In this regard, a case where the second inclination angle θA2 is 0 degrees may mean that the second inclined side wall SA2 extends in a plane perpendicular to the main surface 100M of the substrate 110, for example, the X-Z plane, in parallel to the first direction (Z direction).

The first base portion B1 may have a fourth inclined side wall SA4 extending at a fourth inclination angle θA4 with respect to the first direction (Z direction) (θA4<θA1). As illustrated in FIG. 2, the fourth inclined side wall SA4 of the first base portion B1 may be covered by the first device isolation film 112.

In the first fin-shaped active area FA of the first area I, a bottom surface 132L of the first lower section active area 132 may have a first width WA1 in a width/lateral direction (Y direction) of the first fin-shaped active area FA. The first width WA1 may be smaller/narrower than the width BW1 of the bottom surface B1L of the first base portion B1 (WA1<BW1). A bottom surface 134L of the first middle section active area 134 may have a second width WA2 smaller/narrower than the first width WA1 in the width/lateral direction (Y direction) of the first fin-shaped active area FA (WA2<WA1). A bottom surface 136L of the first upper section active area 136 may have a third width WA3 smaller/narrower than the second width WA2 in the width/lateral direction (Y direction) of the first fin-shaped active area FA (WA3<WA2). A bottom surface 138L of the first tip active area 138 may have a first tip width TW1 smaller/narrower than the third width WA3 in the width/lateral direction (Y direction) of the first fin-shaped active area FA (TW1<WA3).

In some embodiments, the first fin-shaped active area FA may have a relatively great (e.g., large/high) aspect ratio and may have a height FH1 that is at least 4 times the width BW1 of the bottom surface B1L of the first base portion B1. In some embodiments, a height TH1 from the bottom surface 132L of the first lower section active area 132 to an apex of the first tip active area 138 may be at least 3 times the first width WA1 of the bottom surface 132L of the first lower section active area 132.

In some embodiments, the fourth height HA4 of the first tip active area 138 may be smaller than at least one height among the first height HA1 of the first lower section active area 132, the second height HA2 of the first middle section active area 134, and the third height HA3 of the first upper section active area 136.

As illustrated in FIG. 2, the first fin-shaped transistor TR1 of the first area I of the integrated circuit device 100 may include a first gate dielectric film 152 covering the first top portion T1 of the first fin-shaped active area FA and a first gate line 162 covering the first top portion T1 of the first fin-shaped active area FA, the first top portion T1 and the first gate line 162 having the first gate dielectric film 152 interposed therebetween. The first gate line 162 may constitute the first gates GA illustrated in FIG. 1.

The first gate dielectric film 152 may extend to cover the first inclined side wall SA1 of the first top portion T1, the second inclined side wall SA2, the third inclined side wall SA3, and the rounded outer surface RA. The first gate line 162 may cover the first inclined side wall SA1 of the first top portion T1, the second inclined side wall SA2, the third inclined side wall SA3, and the rounded outer surface RA, with the first gate dielectric film 152 interposed therebetween.

Figure 3B:
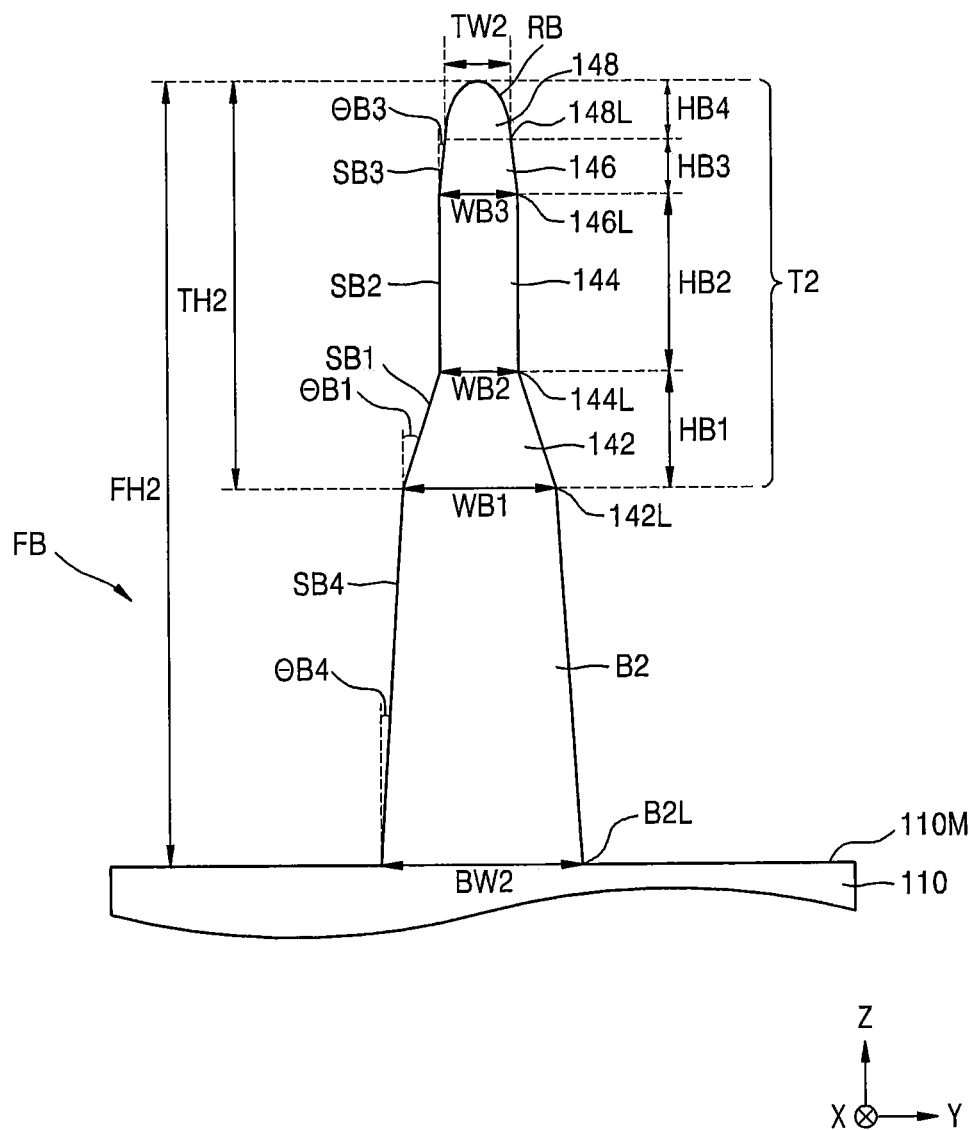
FIG. 3B is an enlarged cross-sectional view for describing in more detail a second fin-shaped active area of an integrated circuit device, according to some example embodiments of present inventive concepts.

FIG. 3B is an enlarged cross-sectional view for describing in more detail the second fin-shaped active area FB described with reference to FIGS. 1 and 2, according to example embodiments of present inventive concepts.

A single/individual second fin-shaped active area FB among the plurality of second fin-shaped active areas FB is illustrated in FIG. 3B. A detailed description of the second fin-shaped active area FB that will be described with reference to FIG. 3B may apply to any of the plurality of second fin-shaped active areas FB illustrated in FIG. 1.

Referring to FIG. 3B, the second top portion T2 of the second fin-shaped active area FB formed in the second area II may include a second lower section active area 142, a second middle section active area 144, a second upper section active area 146, and a second tip active area 148 that are sequentially disposed/positioned from the second base portion B2 in the first direction (Z direction) and are integrally connected to each other.

The second lower section active area 142 may protrude from the second base portion B2 in the first direction (Z direction) and have a first inclined side wall SB1 extending to have a first inclination angle θB1. In this regard, an "inclination angle" in the second area II means an angle formed by a surface perpendicular to the main surface 110M of the substrate 110 and extending in the same direction as a direction in which the second fin-shaped active area FB extends, for example, the X-Z plane, and a side wall of the second fin-shaped active area FB. The second lower section active area 142 may have a first height HB1. In some embodiments, the first height HB1 of the second lower section active area 142 may be greater than the first height HA1 of the first lower section active area 132 formed in the first area I (HB1<HA1). A first inclination angle θB1 of the first inclined side wall SB1 included in the second lower section active area 142 may be greater than the first inclination angle θA1 (see FIG. 3A) of the first inclined side wall SA1 included in the first lower section active area 132 formed in the first area I (θA1<θB1).

The second middle section active area 144 may protrude from the second lower section active area 142 in the first direction (Z direction) and have a second side wall SB2 extending to have an inclination angle smaller than the first inclination angle θB1. In some embodiments, the inclination angle of the second side wall SB2 included in the second middle section active area 144 may be 0 degrees. Accordingly, the second side wall SB2 may extend in a plane perpendicular to the main surface 110M of the substrate 110, for example, the X-Z plane, in the first direction (Z direction). The second middle section active area 144 may have a second height HB2. In some embodiments, the second height HB2 of the second middle section active area 144 may be greater than the first height HB1 of the second lower section active area 142 (HB1<HB2). In some embodiments, the second height HB2 of the second middle section active area 144 may be greater than the height HA2 of the first middle section active area 134 formed in the first area I (HA2<HB2).

The second upper section active area 146 may protrude from the second middle section active area 144 in the first direction (Z direction) and have a third inclined side wall SB3 extending to have a third inclination angle θB3. In some embodiments, the third inclination angle θB3 of the third inclined side wall SB3 may be smaller than the first inclination angle θB1 of the first inclined side wall SB1 (θB3<θB1). The second upper section active area 146 may have a third height HB3. In some embodiments, the third height HB3 of the second upper section active area 146 may be the smaller than the second height HB2 of the second middle section active area 144 (HB3<HB2).

The second tip active area 148 may protrude from the second upper section active area 146 in the first direction (Z direction) and have a rounded outer surface RB. The second tip active area 148 may have a fourth height HB4. The rounded outer surface RB of the second tip active area 148 may have a predetermined curvature radius determined according to a second tip width TW2 and the fourth height HB4 of the second tip active area 148. In some embodiments, the curvature radius of the rounded outer surface RB of the second tip active area 148 may be the same as or greater than that of the rounded outer surface RA of the first tip active area 138.

The second base portion B2 may have a fourth inclined side wall SB4 extending at a fourth inclination angle θB4 with respect to the first direction (Z direction) (θB4<θB1). As illustrated in FIG. 2, the fourth inclined side wall SB4 of the second base portion B2 may be covered by the second device isolation film 114.

In the second fin-shaped active area FB, a bottom surface 142L of the second lower section active area 142 may have a first width WB1 in a width/lateral direction (Y direction) of the second fin-shaped active area FB. The first width WB1 may be smaller/narrower than the width BW2 of a bottom surface B2L of the second base portion B2 (WB1<BW2).

In the second fin-shaped active area FB, a bottom surface 144L of the second middle section active area 144 may have a second width WB2 smaller/narrower than the first width WB1 in the width/lateral direction (Y direction) of the second fin-shaped active area FB (WB2<WB1). The second width WB2 of the second middle section active area 144 included in the second fin-shaped active area FB may be smaller/narrower than the second width WA2 of the first middle section active area 134 of the first fin-shaped active area FA formed in the first area I (WB2<WA2). In some embodiments, the second width WB2 of the second middle section active area 144 may be smaller/narrower than the second width WA2 of the first middle section active area 134 formed in the first area I by about 1 nm but is not limited thereto. For example, in some embodiments, the second width WB2 may be narrower than the second width WA2 by at least 1 nm.

In the second fin-shaped active area FB, a bottom surface 146L of the second upper section active area 146 may have a third width WB3 that is the same as or smaller/narrower than the second width WB2 in the width/lateral direction (Y direction) of the second fin-shaped active area FB (WB3≤WB2). The third width WB3 of the second upper section active area 146 may be smaller/narrower than the third width WA3 of the first upper section active area 136 formed in the first area I (WB3<WA3).

In the second fin-shaped active area FB, a bottom surface 148L of the second tip active area 148 may have a second tip width TW2 smaller/narrower than the third width WB3 in the width/lateral direction (Y direction) of the second fin-shaped active area FB. The second tip width TW2 of the second tip active area 148 may be smaller/narrower than the first tip width TW1 (see FIG. 3A) of the first tip active area 138 formed in the first area I (TW2<TW1).

In some embodiments, the second fin-shaped active area FB may have a relatively great (e.g., large/high) aspect ratio and may have a height FH2 that is at least 4 times the width BW2 of the bottom surface B2L of the second base portion B2. In some embodiments, a height TH2 from the bottom surface 142L of the second lower section active area 142 to an apex of the second tip active area 148 may be at least 3 times the first width WB1 of the bottom surface 142L of the second lower section active area 142. An aspect ratio of the second fin-shaped active area FB may be greater (e.g., larger/higher) than that of the first fin-shaped active area FA formed in the first area I. That is, when the width BW1 of the bottom surface B1L of the first base portion B1 formed in the first area I and the width BW2 of the bottom surface B2L of the second base portion B2 formed in the second area II are the same, the height FH2 of the second fin-shaped active area FB formed in the second area II may be greater than the height FH1 of the first fin-shaped active area FA formed in the first area I. When the first width WA1 of the bottom surface 132L of the first lower section active area 132 formed in the first area I and the first width WB1 of the bottom surface 142L of the second lower section active area 142 formed in the second area II are the same, the height TH2 of the second top portion T2 of the second fin-shaped active area FB formed in the second area II may be greater than the height TH1 of the first top portion T1 of the first fin-shaped active area FA formed in the first area I.

In some embodiments, the fourth height HB4 of the second tip active area 148 in the first direction (Z direction) may be smaller than at least one height among the first height HB1 of the second lower section active area 142, the second height HB2 of the second middle section active area 144, and the third height HB3 of the second upper section active area 146. In some embodiments, the fourth height HB4 of the second tip active area 148 may be greater than the fourth height HA4 of the first tip active area 138 formed in the first area I but is not limited thereto.

As illustrated in FIG. 2, the second fin-shaped transistor TR2 of the second area II of the integrated circuit device 100 may include a second gate dielectric film 154 covering the second top portion T2 of the second fin-shaped active area FB and a second gate line 164 covering the second top portion T2 of the second fin-shaped active area FB, with the second gate dielectric film 154 interposed between the second top portion T2 and the second gate line 164. The second gate line 164 may constitute the second gates GB illustrated in FIG. 1.

The second gate dielectric film 154 may extend to cover the first inclined side wall SB1 of the second top portion T2, the second side wall SB2, the third inclined side wall SB3, and the rounded outer surface RB. The second gate line 164 may cover the first inclined side wall SB1 of the second top portion T2, the second side wall SB2, the third inclined side wall SB3, and the rounded outer surface RB, with the second gate dielectric film 154 interposed therebetween.

In some embodiments, each of the first and second gate dielectric (e.g., insulating) films 152 and 154 may be formed of a silicon oxide layer, a high-k dielectric layer or a combination thereof. The high-k dielectric layer may be formed of a material having a higher dielectric constant than that of a silicon oxide layer. For example, the first and second gate dielectric/insulating films 152 and 154 may have a dielectric constant of about 10 to about 25. The high-k dielectric layer may be formed of a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination of thereof, but is not limited thereto. The first and second gate dielectric/insulating films 152 and 154 may be formed using an atomic layer deposition (ALD) process, a chemical vapor deposition (CVD) process, or a physical vapor deposition (PVD) process. In some embodiments, the first and second gate dielectric/insulating films 152 and 154 may have the same stack structure. Alternatively, the first and second gate dielectric/insulating films 152 and 154 may have different stack structures.

The first and second gate lines 162 and 164 may include a metal-containing layer for adjusting a work function and a gap-fill metal containing layer for filling a space formed in an upper portion of the metal-containing layer. In some embodiments, the first and second gate lines 162 and 164 may have a structure in which a metal nitride layer, a metal layer, a conductive capping layer, and a gap-fill metal film are sequentially stacked. The metal nitride layer and the metal layer may include at least one selected from the group consisting of Titanium (Ti), Tungsten (W), Ruthenium (Ru), Niobium (Nb), Molybdenum (Mo), Hafnium (Hf), Nickel (Ni), Cobalt (Co), Platinum (Pt), Ytterbium (Yb), Terbium (Tb), Dysprosium (Dy), Erbium (Er), and Palladium (Pd). Each of the metal nitride layer and the metal layer may be formed using an ALD process, a metal organic ALD (MOALD) process, or a metal organic CVD (MOCVD) process. The conductive capping layer may function as a protection layer protecting/preventing a surface of the metal layer from being oxidized. The conductive capping layer may function as a wetting layer for facilitating deposition when another conductive layer is deposited on the metal layer. The conductive capping layer may be formed of a metal nitride such as Titanium Nitride (TiN) or Tantalum Nitride (TaN) or a combination thereof, but is not limited thereto. The gap-fill metal film may extend on the conductive capping layer. The gap-fill metal film/layer may be formed of a W film. The gap-fill metal film may be formed using an ALD process, a CVD process, or a PVD process. The gap-fill metal film may fill a recess space formed by a stepped portion on an upper surface of the conductive capping layer/film, without a void.

As illustrated in FIG. 1, first source/drain areas 172 may be formed on both sides of the first gates GA in the plurality of first fin-shaped active areas FA in the first area I. Second source/drain areas 174 may be formed on both sides of the second gates GB in the second fin-shaped active areas FB in the second area II.

In some embodiments, at least one of the first and second source/drain areas 172 and 174 may include an impurity ion injection area/region formed in a portion of the first and second fin-shaped active areas FA and FB. In some embodiments, at least one of the first and second source/drain areas 172 and 174 may include a semiconductor layer that is epitaxially grown from the first and second fin-shaped active areas FA and FB. At least one of the first and second source/drain areas 172 and 174 may include an embedded SiGe structure including a plurality of epitaxially grown SiGe layers, an epitaxially grown Si layer, or an epitaxially grown SiC layer.

As described with reference to FIGS. 1 through 3B above, the integrated circuit device 100 may include fin-shaped active areas having different respective shapes in the first area I and the second area II, thereby relatively easily controlling a leakage current in a highly-scaled field effect transistor (FET), improving performance of the FET, and relatively easily implementing multi-gate transistors performing different functions in the first area I and the second area II. Moreover, the present inventive entity appreciates that the different shapes described herein may refer to different aspect ratios and/or surfaces with different angles/curvatures.

Figure 4:
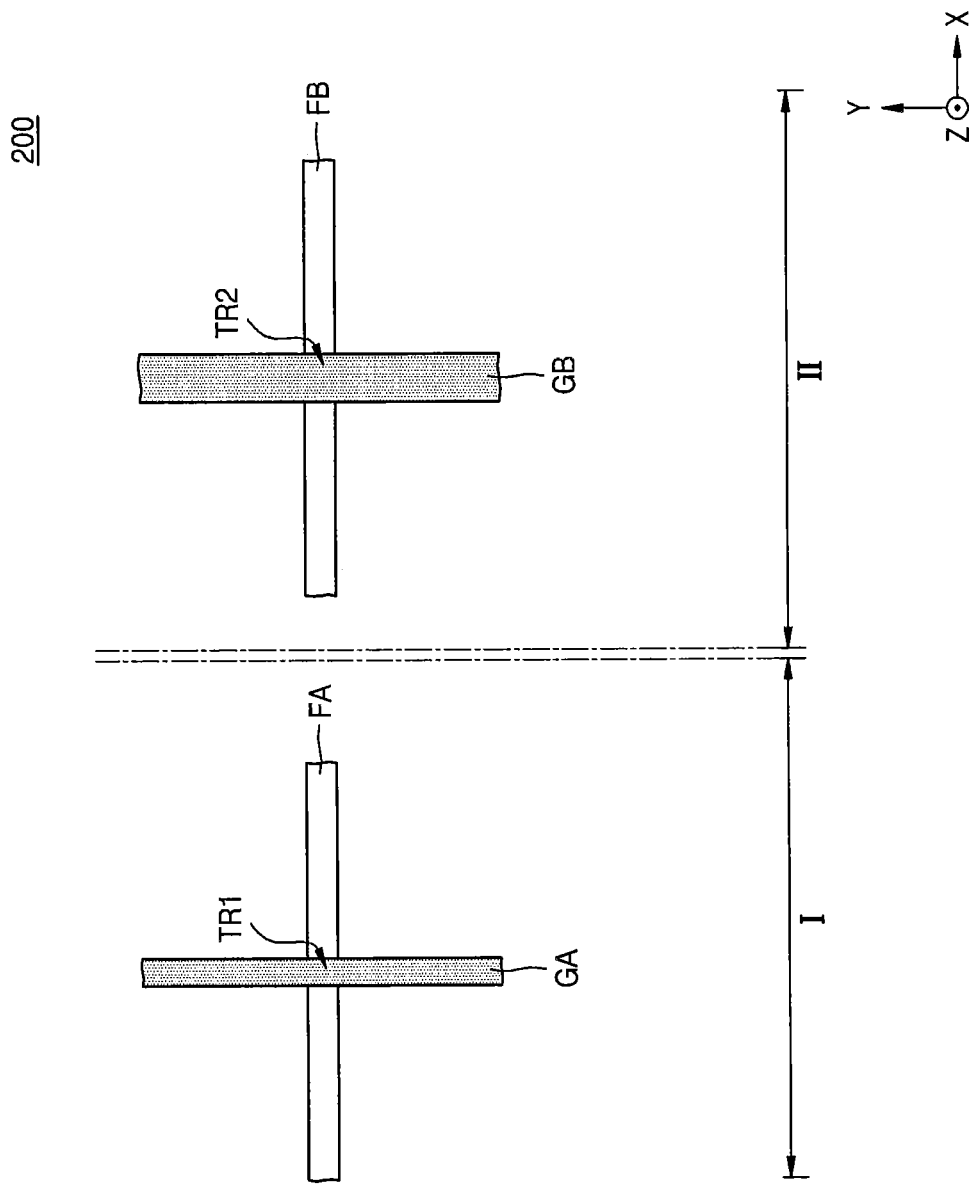
FIG. 4 is a plan layout diagram of an integrated circuit device, according to some example embodiments of present inventive concepts.

FIG. 4 is a plan layout diagram of an integrated circuit device 200, according to example embodiments of present inventive concepts. Like reference numerals between FIGS. 1 and 4 denote like elements, and thus detailed descriptions thereof may be omitted.

Referring to FIG. 4, the integrated circuit device 200 may include the first area I and the second area II.

In the integrated circuit device 200, the first gate GA may extend across the first fin-shaped active area FA in the first area I, and the second gate GB may extend across the second fin-shaped active area FB in the second area II.

However, present inventive concepts are not limited to the integrated circuit device illustrated in FIGS. 1 and 4. For example, more than one gate may extend across more than one fin-shaped active area in each of the first area I and the second area II, and the number of gates and the number of fin-shaped active areas are not limited to the numbers/quantities illustrated in FIGS. 1 and 4.

Figure 5:
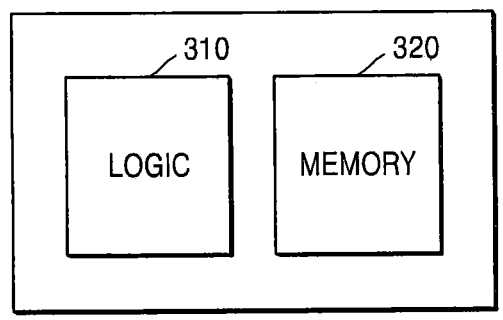
FIG. 5 is a plan layout diagram of an integrated circuit device, according to some example embodiments of present inventive concepts.

FIG. 5 is a plan layout diagram of an integrated circuit device 300, according to example embodiments of present inventive concepts.

Referring to FIG. 5, the integrated circuit device 300 may include a logic area 310 and a memory area 320.

The logic area 310 may correspond to the first area I described with reference to FIG. 1 above and may include the first fin-shaped active area FA described with reference to FIGS. 1, 2, and 3A above. The logic area 310 may include various types of logic cells including a plurality of circuit elements such as a transistor, a register, etc. as a standard cell performing a desired logic function such as a buffer. The logic cell may include, for example, AND, NAND, OR, NOR, XOR (exclusive OR), XNOR (exclusive NOR), INV (inverter), ADD (adder), BUF (buffer), DLY (delay), FIL (filter), multiplexer (MXT/MXIT), OAI (OR/AND/INVERTER), AO (AND/OR), AOI (AND/OR/INVERTER), D flip-flop, reset flip-flop, master-slave flip-flop, latch, and the like. However, the above cells are merely examples and the logic cell according to present inventive concepts are not limited thereto.

The memory area 320 may correspond to the second area II described with reference to FIG. 1 above and may include the second fin-shaped active area FB described with reference to FIGS. 1, 2, and 3B above. The memory area 320 may include at least one of SRAM, DRAM, MRAM, RRAM, and PRAM.

Figure 6A:
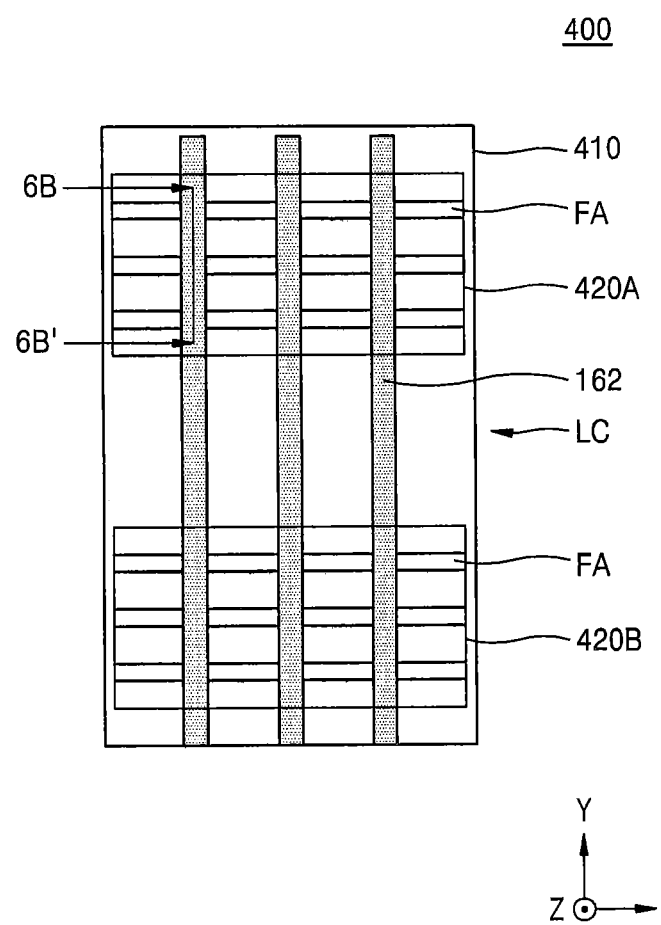
FIG. 6A is a plan view of a logic device that may be included in a logic area of the integrated circuit device of FIG. 5.
Figure 6B:
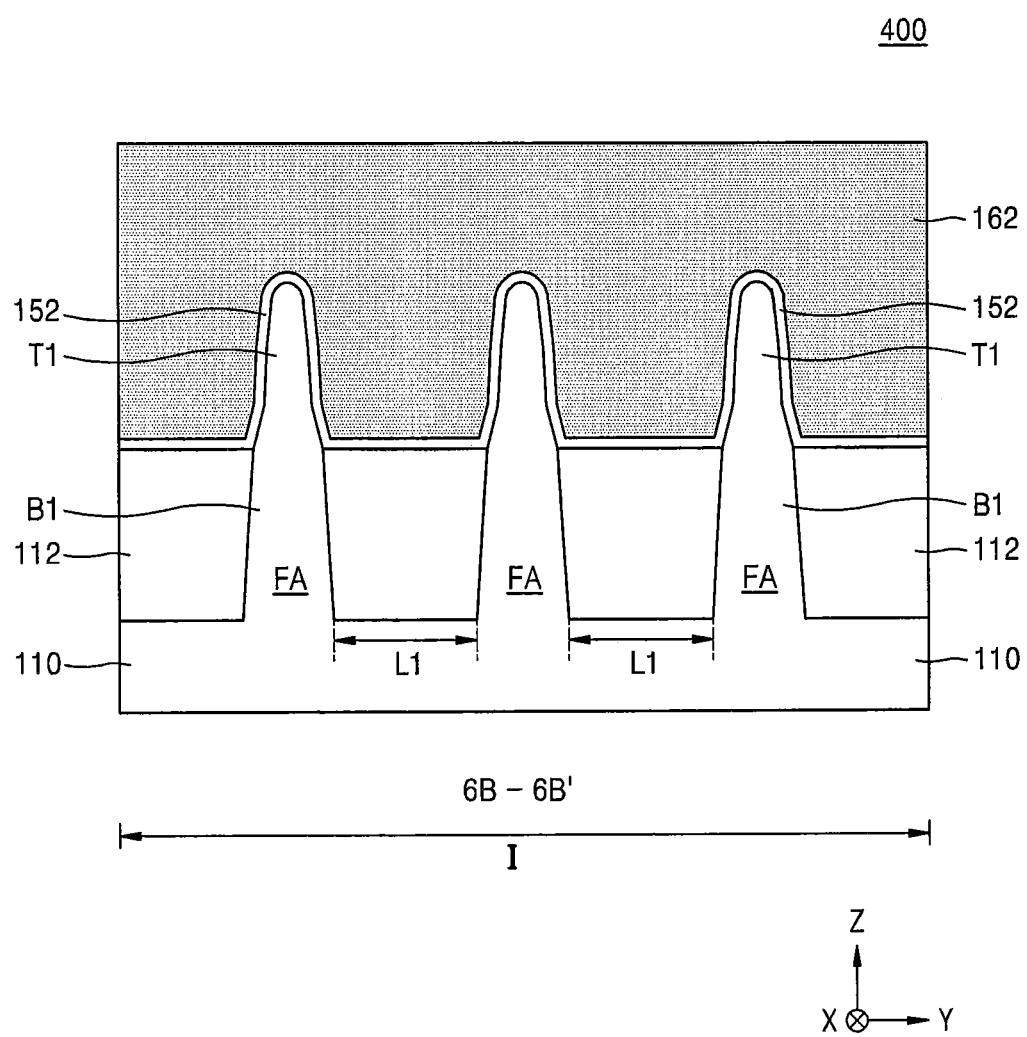
FIG. 6B is a cross-sectional view of the device taken along a line 6B-6B' of FIG. 6A.

FIG. 6A is a plan view of a logic device 400 that may be included in the logic area 310 of the integrated circuit device 300 of FIG. 5. FIG. 6B is a cross-sectional view of the device 400 taken along a line 6B-6B' of FIG. 6A. Like reference numerals between FIGS. 1 through 5 and FIGS. 6A and 6B denote like elements, and thus detailed descriptions thereof may be omitted.

Referring to FIGS. 6A and 6B, the logic device 400 may include a cell LC that is formed on the substrate 110 and includes a cell boundary 410 and at least one logic function circuit.

The cell LC may include a first device area 420A and a second device area 420B. The plurality of first fin-shaped active areas FA may extend in one direction (X direction) within the first device area 420A and the second device area 420B.

The first device isolation film 112 may be formed between the plurality of first fin-shaped active areas FA on the substrate 110. The plurality of first fin-shaped active areas FA may protrude from the first device isolation film 112 in fin shapes.

The plurality of first fin-shaped active areas FA may be formed at a constant pitch within the first device area 420A and the second device area 420B. Accordingly, a spaced distance L1 between the plurality of first fin-shaped active areas FA may be constant.

The plurality of first gate lines 162 may extend across the plurality of first fin-shaped active areas FA in a second direction (Y direction) in the cell LC. Transistors may be formed at points where the plurality of first gate lines 162 and the plurality of first fin-shaped active areas FA cross/ intersect each other. The plurality of first gate lines 162 may be respectively shared by a plurality of FinFET devices formed on the substrate 110.

The logic device 400 may have characteristics of the first fin-shaped active area FA and the first gate line 162 of the integrated circuit device 100 described with reference to FIGS. 1, 2, and 3A above.

Figure 7A:
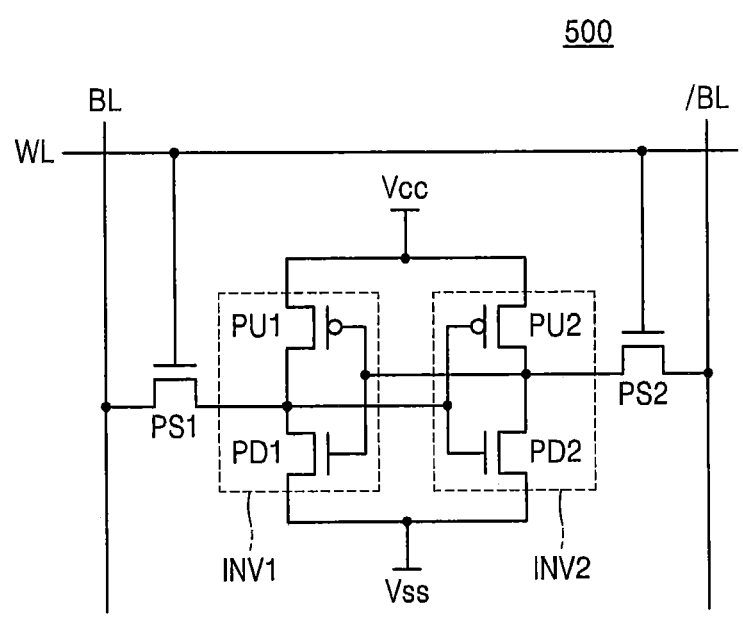
FIG. 7A is a circuit diagram illustrating a memory device that may be included in a memory area of the integrated circuit device of FIG. 5.
Figure 7B:
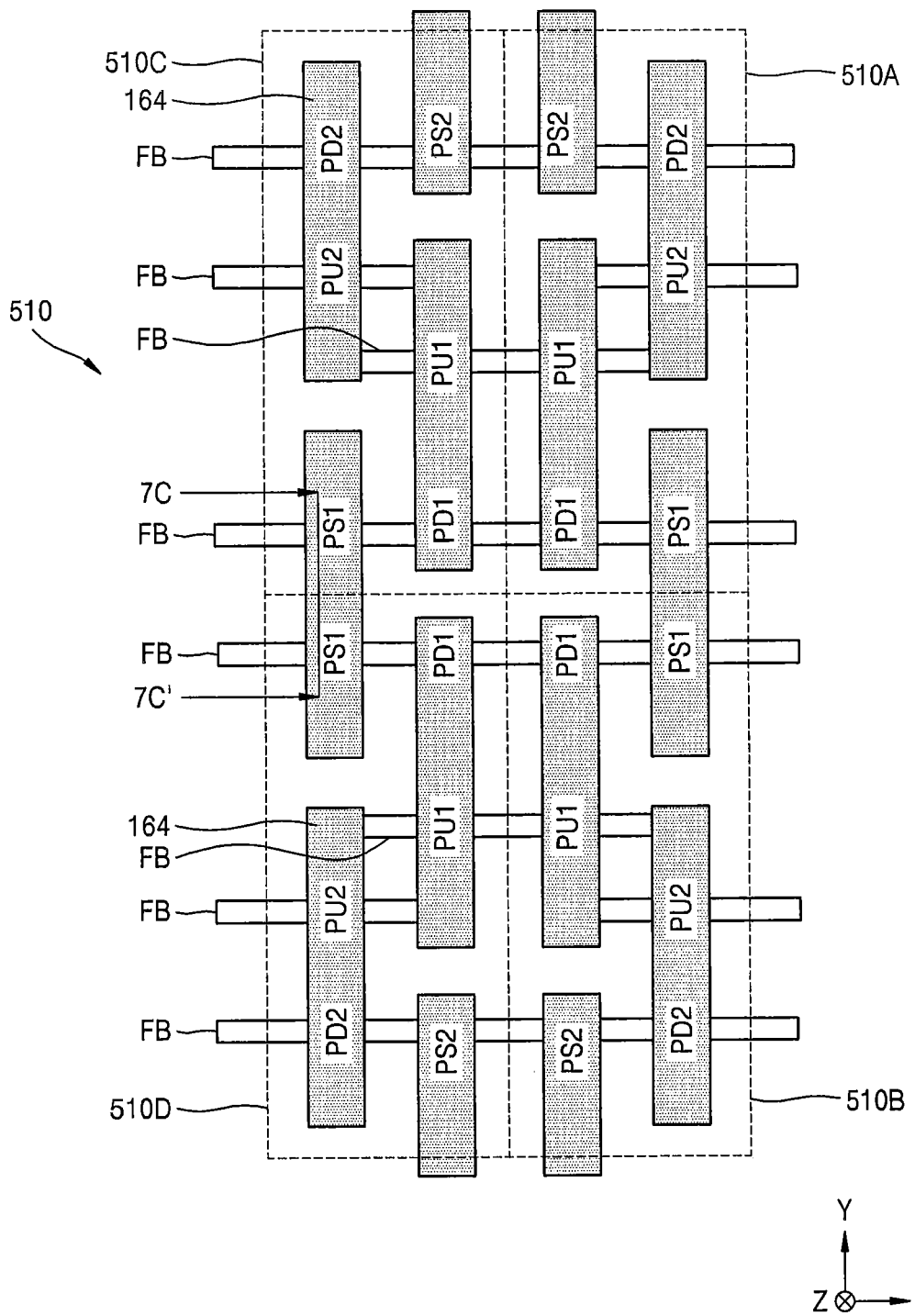
FIG. 7B is a plan view of the memory device of FIG. 7A.
Figure 7C:
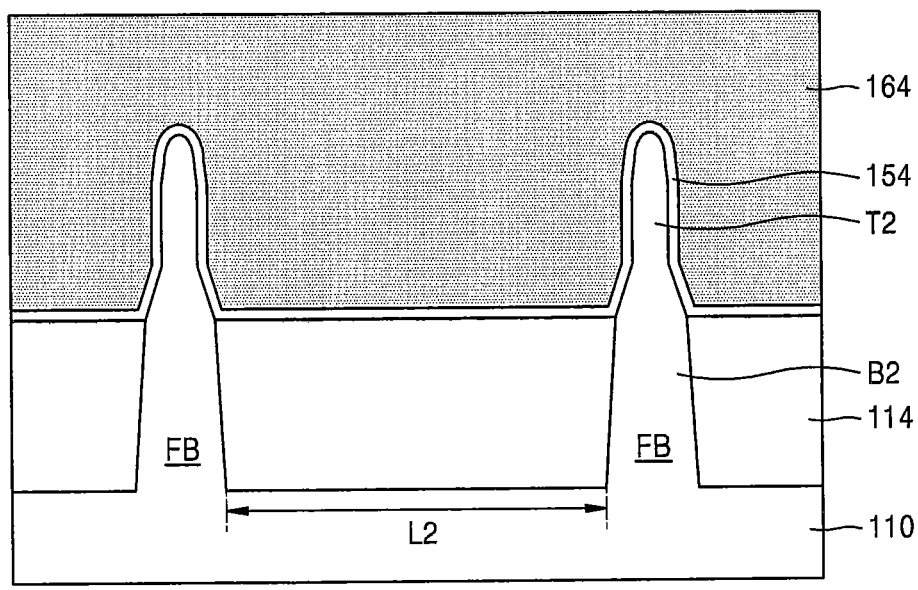
FIG. 7C is a cross-sectional view of the memory device taken along a line 7C-7C' of FIG. 7B.
Figure 7C:
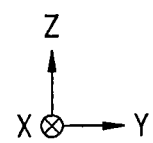

FIG. 7A is a circuit diagram illustrating a memory device 500 that may be included in the memory area 320 of the integrated circuit device 300 of FIG. 5. FIG. 7A is a circuit diagram of a 6 T SRAM cell including 6 transistors. FIG. 7B is a plan view of the memory device 500 of FIG. 7A. FIG. 7C is a cross-sectional view of the memory device 500 taken along a line 7C-7C' of FIG. 7B. Like reference numerals between FIGS. 1 through 5 and FIGS. 7A through 7C denote like elements, and thus detailed descriptions thereof may be omitted.

Referring to FIG. 7A, the memory device 500 may include a pair of inverters INV1 and INV2 connected in parallel to each other between a power node Vcc and a ground node Vss and a first pass transistor PS1 and a second pass transistor PS2 that are respectively connected to the inverters INV1 and INV2. The first pass transistor PS1 and the second pass transistor PS2 may be respectively connected to a bit line BL and a complementary bit line/BL. Gates of the first pass transistor PS1 and the second pass transistor PS2 may be connected to a word line WL.

The first inverter INV1 may include a first pull-up transistor PU1 and a first pull-down transistor PD1 that are connected in serial to each other. The second inverter INV2 may include a second pull-up transistor PU2 and a second pull-down transistor PD2 that are connected in serial to each other. The first pull-up transistor PU1 and the second pull-up transistor PU2 may be configured as a PMOS transistor. The first pull-down transistor PD1 and the second pull-down transistor PD2 may be configured as an NMOS transistor.

For the first inverter INV1 and the second inverter INV2 to form one latch circuit, an input node of the first inverter INV1 may be connected to an output node of the second inverter INV2, and an input node of the second inverter INV2 may be connected to an output node of the first inverter INV1.

FIG. 7B is a plan view of the memory device 500 of FIG. 7A. FIG. 7C is a cross-sectional view of the memory device 500 taken along a line 7C-7C' of FIG. 7B. Like reference numerals between FIGS. 1 through 5 and FIGS. 7 and 7C denote like elements, and thus detailed descriptions thereof may be omitted.

Referring to FIGS. 7B and 7C, the memory device 500 may include an SRAM array 510 including a plurality of SRAM cells 510A, 510B, 510C, and 510D arranged in a matrix on the substrate 110. The four SRAM cells 510A, 510B, 510C, and 510D including 6 FinFETs per one memory cell are illustrated in FIGS. 7B and 7C.

The plurality of SRAM cells 510A, 510B, 510C, and 510D may have a circuit diagram illustrated in FIG. 7A.

The plurality of SRAM cells 510A, 510B, 510C, and 510D may include the plurality of second fin-shaped active areas FB protruding from the substrate 110 and extending in parallel to each other in one direction (X direction).

The second device isolation film 114 may be formed between the plurality of second fin-shaped active areas FB on the substrate 110. The plurality of second fin-shaped active areas FB may protrude from the second device isolation film 114 in fin shapes.

The plurality of second gate lines 164 may extend in a direction (Y direction) across the plurality of second fin-shaped active areas FB while covering the second top portion T2 of the plurality of second fin-shaped active areas FB in the plurality of SRAM cells 510A, 510B, 510C, and 510D.

The plurality of second fin-shaped active areas FB may be formed at variable pitches in the plurality of SRAM cells 510A, 510B, 510C, and 510D. Accordingly, spaced distances L2 between the plurality of second fin-shaped active areas FB may be different according to positions. In some embodiments, the spaced distances L2 between the plurality of second fin-shaped active areas FB may be greater/longer than the spaced distances L1 between the plurality of first fin-shaped active areas FA formed in the logic area 310 of the integrated circuit device 100 illustrated in FIG. 5, for example, the plurality of first fin-shaped active areas FA included in the logic device 400 illustrated in FIGS. 6A and 6B.

The first pull-up transistor PU1, the first pull-down transistor PD1, the first pass transistor PS1, the second pull-up transistor PU2, the second pull-down transistor PD2, and the second pass transistor PS2 that are included in the plurality of SRAM cells 510A, 510B, 510C, and 510D may be implemented as a plurality of FinFET devices formed at points where the plurality of gate lines 164 and the plurality of second fin-shaped active areas FB cross/intersect each other.

For example, transistors may be formed in six respective crossing points of the plurality of second fin-shaped active areas FB and the plurality of second gate lines 164 in the SRAM cell 510A, and may include the first pass transistor PS1, the second pass transistor PS2, the first pull-down transistor PD1, the second pull-down transistor PD2, the first pull-up transistor PU1, and the second pull-up transistor PU2.

Each of the first pull-up transistor PU1 and the second pull-up transistor PU2 may be configured as a PMOS transistor. Each of the first pull-down transistor PD1, the second pull-down transistor PD2, the first pass transistor PS1, and the second pass transistor PS2 may be configured as an NMOS transistor.

The memory device 500 may have characteristics of the second fin-shaped active area FB and the second gate line 164 of the integrated circuit device 100 described with reference to FIGS. 1, 2, and 3B above.

FIGS. 8A through 8D are cross-sectional views for sequentially describing a method of manufacturing the integrated circuit device 100, according to example embodiments of present inventive concepts. FIGS. 8A through 8D are cross-sectional views of the integrated circuit device 100 taken along the line 2A-2A' and the line 2B-2B' of FIG. 1. The example method of manufacturing the integrated circuit device 100 illustrated in FIGS. 1 and 2 will now be described with reference to FIGS. 8A through 8D. Like reference numerals between FIGS. 1 through 3B and FIGS. 8A through 8D denote like elements, and thus detailed descriptions thereof may be omitted.

Figure 8A:
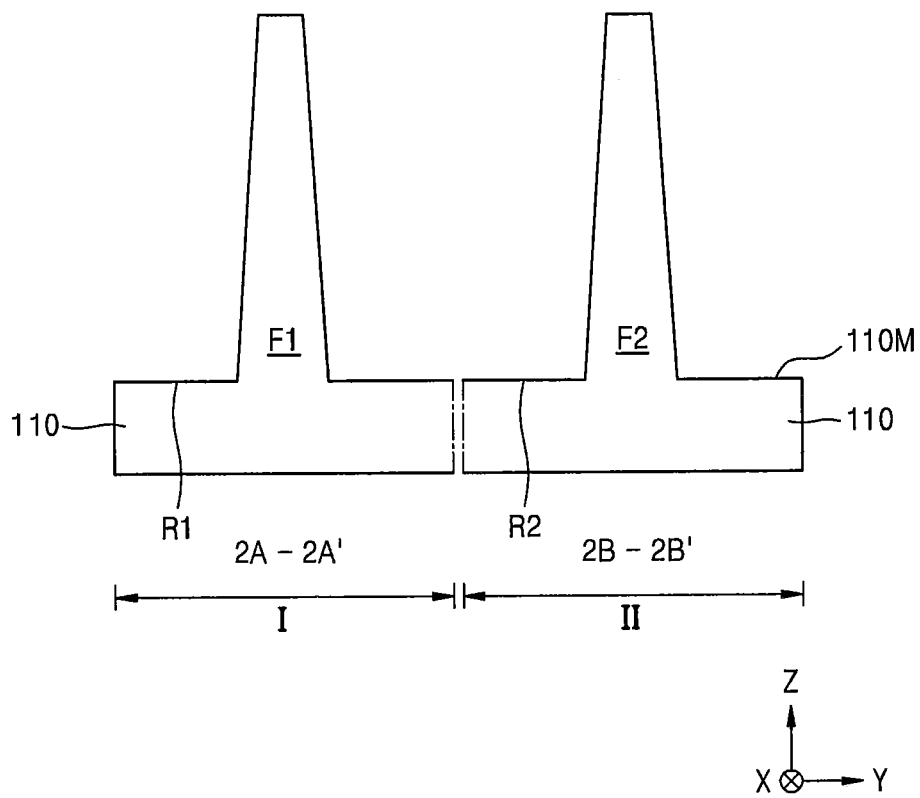
FIGS. 8A through 8D are cross-sectional views for sequentially describing a method of manufacturing an integrated circuit device, according to some example embodiments of present inventive concepts.

Referring to FIG. 8A, the substrate 110 including the first area I and the second area II may be prepared. Thereafter, a part of the substrate 110 may be removed, a plurality of first trenches R1 may be formed in the first area I of the substrate 110, a plurality of second trenches R2 may be formed in the second area II of the substrate 110, and a plurality of preliminary active areas F1 and F2 defined by the plurality of first and second trenches R1 and R2 may be formed. The plurality of preliminary active areas F1 and F2 may include the first preliminary active area F1 formed in the first area I and the second preliminary active area F2 formed in the second area II.

The first preliminary active area F1 and the second preliminary active area F2 may protrude upward along a direction (Z direction) perpendicular to the main surface 110M of the substrate 110, may extend in one direction (X direction), and may be fin-shaped.

The first area I may be used to form the plurality of first fin-shaped active areas FA arranged at an invariable (e.g., constant/fixed) pitch as illustrated in FIG. 6A. Accordingly, a plurality of the first preliminary active areas F1 arranged at the invariable pitch may be formed in the first area I. Meanwhile, the second area II may be used to form the plurality of second fin-shaped active areas FB arranged at variable pitches as illustrated in FIG. 7B. Accordingly, a plurality of the second preliminary active areas F2 arranged at variable pitches may be formed in the second area II.

In some embodiments, to form the plurality of first and second trenches R1 and R2, a plurality of mask patterns covering a part of an upper surface of the substrate 110 that is to be an active area may be formed, and the substrate 110 may be etched by using the plurality of mask patterns as an etch mask. The plurality of mask patterns may have a structure in which a pad oxide film pattern and a nitride film pattern are sequentially stacked but are not limited thereto.

Figure 8B:
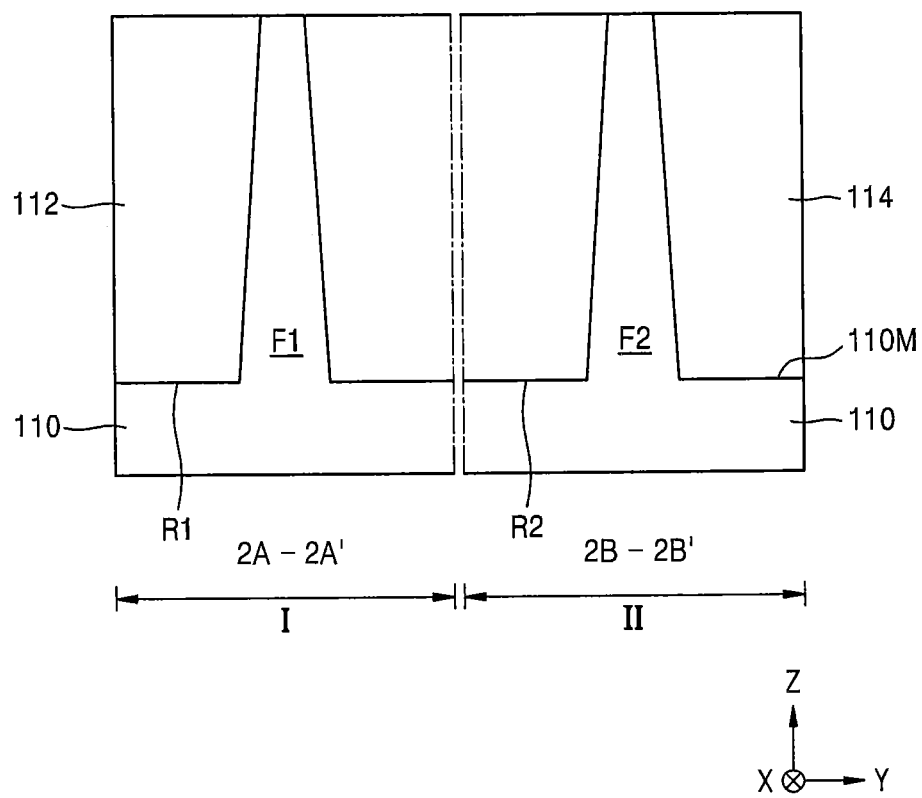

Referring to FIG. 8B, the first and second device isolation films 112 and 114 respectively filling the plurality of first and second trenches R1 and R2 may be formed in the first area I and the second area II of the substrate 110.

The first device isolation film 112 and the second device isolation film 114 may have planar upper surfaces. An upper surface of the first device isolation film 112 may be positioned at the same level as an upper surface of the first preliminary active area F1 in the first area I. An upper surface of the second device isolation film 114 may be positioned at the same level as an upper surface of the second preliminary active area F2 in the second area II.

In some embodiments, the first device isolation film 112 and the second device isolation film 114 may include an oxide film, a nitride film, or a combination of these, but are not limited thereto.

Figure 8C:
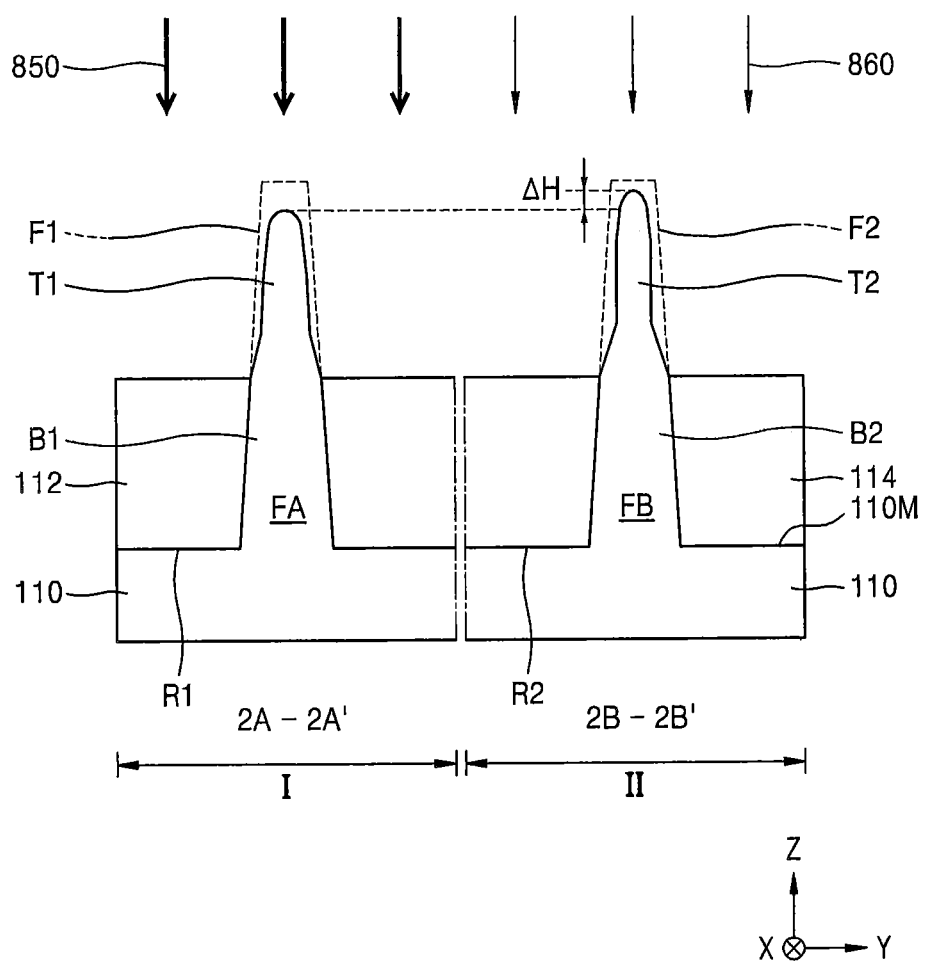

Referring to FIG. 8C, a recess process may be simultaneously performed on the first and second device isolation films 112 and 114. The recess process may remove portions of the first and second device isolation films 112 and 114 from the upper surfaces of the first and second device isolation films 112 and 114 illustrated in FIG. 8B in the first area I and the second area II.

In some embodiments, a dry etching process, a wet etching process, or an etching process in combination of the dry and wet etch processes may be used to perform the recess process on the first and second device isolation films 112 and 114. An etching process of a same condition may be performed in the first area I and the second area II to perform the recess process on the first and second device isolation films 112 and 114.

During the recess process on the first and second device isolation films 112 and 114, a part of the upper surfaces of the first preliminary active area F1 and the second preliminary active area F2 that are exposed in the first area I and the second area I may be consumed because the upper surfaces of the first preliminary active area F1 and the second preliminary active area F2 may be exposed to an etching atmosphere and/or a cleaning atmosphere and accordingly consumed due to oxidation and/or cleaning.

For example, a reactive ion etching (RIE) process may be used to perform the recess process on the first and second device isolation films 112 and 114. As a result, a part of a surface of the first preliminary active area F1 as indicated in a broken line may be consumed in the first area I, and thus the first fin-shaped active area FA may be obtained as described with reference to FIGS. 1, 2, and 3A, and the first top portion T1 of the first fin-shaped active area FA may be exposed. A part of a surface of the second preliminary active area F2 as indicated in a broken line may be consumed in the second area II, and thus the second fin-shaped active area FB may be obtained as described with reference to FIGS. 1, 2, and 3B, and the second top portion T2 of the second fin-shaped active area FB may be exposed.

In more detail, as described with reference to FIG. 8A, the first area I may include the plurality of first preliminary active areas F1 formed at the invariable (e.g., constant/fixed) pitch, whereas the second area II may include the plurality of second preliminary active areas F2 formed at variable pitches. Accordingly, spaced distances between the plurality of first preliminary active areas F1 may be constant in the first area I and may be smaller than spaced distances between the plurality of second preliminary active areas F2 in the second area II, whereas spaced distances between the plurality of second preliminary active areas F2 may be variable in the second area II and may be greater than spaced distances between the plurality of first preliminary active areas F1 in the first area I.

During the recess process of removing a part of each of the first and second device isolation films 112 and 114 from the resultant structure of FIG. 8B, because the amount of the first device isolation film 112 removed during the recess process may increase, the size of an exposed area of the first top portion T1 of the first preliminary active area F1 may gradually increase in the first area I, and an upper side of the first top portion T1 may be exposed to an etching atmosphere 850 of the first area I for a longer period of time compared to a lower side thereof. A portion of the first top portion T1 exposed to the etching atmosphere 850 of the first area I may be consumed up to a predetermined thickness from an outer surface thereof under the etching atmosphere 850 of the first area I. In particular, scattered reactivity ions under the etching atmosphere 850 of the first device isolation film 112 may collide with an upper portion of the first preliminary active area F1 protruding from the first device isolation film 112, which may result in consuming a surface of the upper portion of the first preliminary active area F1 protruding from the first device isolation film 112 under the etching atmosphere 850 of the first area I. As a result, the amount of the first preliminary active area F1 that is consumed from the surface of the upper portion of the first preliminary active area F1 protruding from the first device isolation film 112 under the etching atmosphere 850 may be greater in a top portion in comparison with side wall portions of the first top portion T1, and the side wall of the first top portion T1 may be tapered away from the first base portion B1 (i.e., the reduction in thickness of the upper portion of the first preliminary active area F1 protruding from the first device isolation film 112 may be greater in the top portion in comparison with the side wall portions).

In the first area I, because the plurality of first preliminary active areas F1 are formed at a constant pitch and spaced distances between the plurality of first preliminary active areas F1 may be relatively small, spaces between the plurality of first preliminary active areas F1 may be relatively small. Accordingly, in portions of the plurality of first preliminary active areas F1 protruding from the first device isolation film 112, top portions may be more influenced by the etching atmosphere 850 than side wall portions. As a result, as illustrated in FIG. 7B, when comparing the first area I and the second area II including the plurality of second preliminary active areas F2 formed at variable pitches, the first fin-shaped active area FA having relatively great width and small height may be obtained in the first area I.

Unlike the first area I, as described with reference to FIG. 8A above, the second area II may include the plurality of second preliminary active areas F2 formed at variable pitches. Accordingly, during the recess process of removing a part of each of the first and second device isolation films 112 and 114 from the resultant structure of FIG. 8B, because a removed amount of the second device isolation film 114 may increase, an exposed area of the second top portion T2 of the second preliminary active area F2 may gradually increase in the second area II, and an upper side of the second top portion T2 may be exposed to an etching atmosphere 860 of the second area II longer than a lower side thereof. A part of the second top portion T2 exposed to the etching atmosphere 860 of the second area II may be consumed by a predetermined thickness from an outer surface thereof under the etching atmosphere 860 of the second area II. In particular, scattered reactivity ions under the etching atmosphere 860 of the second device isolation film 114 may collide with an upper portion of the second preliminary active area F2 protruding from the second device isolation film 114, which may result in consuming a surface of the upper portion of the second preliminary active area F2 protruding from the second device isolation film 114 under the etching atmosphere 860 of the second area II. As a result, an amount or a thickness of the second preliminary active area F2 that is consumed from the surface of the upper portion of the second preliminary active area F2 protruding from the second device isolation film 114 under the etching atmosphere 860 may be greater in a top portion than in side wall portions of the second top portion T2, and the side wall portions may be tapered away from the second base portion B2.

In the second area II, the plurality of second preliminary active areas F2 are formed at variable pitches and may include relatively large spaces therebetween. Accordingly, the spaces between the plurality of second preliminary active areas F2 may be sufficiently exposed to the etching atmosphere 860, and, in portions of the plurality of second preliminary active areas F2 protruding from the second device isolation film 114, side wall portions may be more influenced by the etching atmosphere 860, and a top portion may be less influenced by the etching atmosphere 860, compared to the first preliminary active area F1 of the first area I. As a result, when comparing the second area II and the first area I including the plurality of first preliminary active areas F1 formed at the constant pitch, the second fin-shaped active area FB having relatively small width and great height may be obtained in the second area II.

After forming the first and second fin-shaped active areas FA and FB in the first area I and the second area II, the difference ΔH between a height of an uppermost part of the first fin-shaped active area FA and a height of an uppermost part of the second fin-shaped active area FB may take place. As described with reference to FIGS. 3A and 3B, a width of the second top portion T2 of the second fin-shaped active area FB may be smaller/narrower than that of the first top portion T1 of the first fin-shaped active area FA. In particular, the second width WB2 of the second middle section active area 144 of the second fin-shaped active area FB may be smaller/narrower than the second width WA2 of the first middle section active area 134 of the first fin-shaped area FA.

After the first and second top portions T1 and T2 of the first and second fin-shaped active areas FA and FB are exposed in the first area I and the second area II, a process of injecting impurity ions for adjusting threshold voltages of the first and second top portions T1 and T2 may be performed. During the process of injecting impurity ions for adjusting threshold voltages, boron (B) impurity ions may be injected in an area in which an NMOS transistor is formed in the first and second top portions T1 and T2, and phosphorus (P) or arsenic (As) impurity ions may be injected in an area in which a PMOS transistor is formed.

Figure 8D:
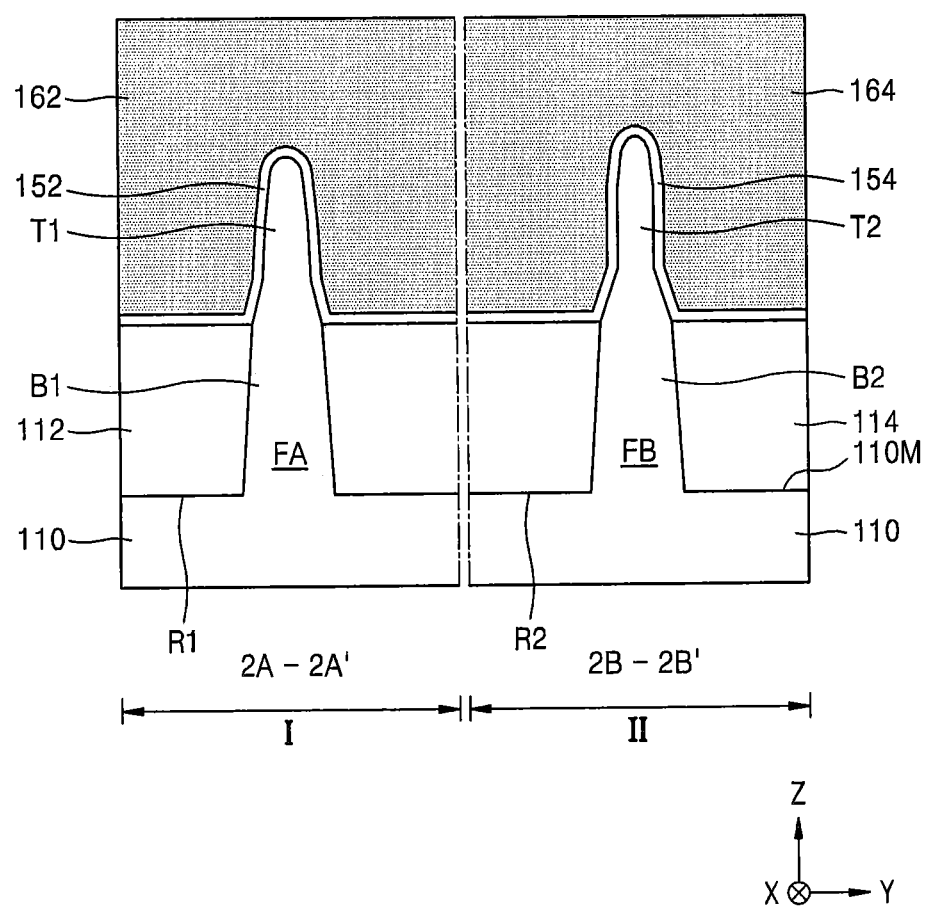

Referring to FIG. 8D, the first gate dielectric film 152 and the first gate line 162 that sequentially cover the first top portion T1 of the first fin-shaped active area FA exposed in the first area I, and the second gate dielectric film 154 and the second gate line 164 that sequentially cover the second top portion T2 of the second fin-shaped active area FB exposed in the second area II may be formed.

The first gate line 162 and the second gate line 164 may respectively constitute the first gate GA and the second gate GB illustrated in FIG. 1.

The first source/drain areas 172 (see FIG. 1) may be formed on both sides of the first gate line 162 in the first fin-shaped active area FA in the first area I, and the second source/drain areas 174 (see FIG. 1) may be formed on both sides of the second gate line 164 in the second fin-shaped active area FB in the second area II, thereby manufacturing the integrated circuit device 100 illustrated in FIGS. 1 through 3B.

In some embodiments, the first gate line 162 and the second gate line 164 and a dummy gate may be formed using a gate-last process (that may be referred to as a replacement poly-gate (RPG) process) but present inventive concepts are not limited thereto. The first and second top portions T1 and T2 of the first and second fin-shaped active areas FA and FB may be respectively provided as channel areas of the first and second fin-shaped transistors TR1 and TR2 (see FIG. 1).

In some embodiments, to form the first gate line 162 and the second gate line 164 using the RPG process, a plurality of insulating spacers providing a plurality of gate spacers and an inter-gate insulating film may be formed on the first and second top portions T1 and T2 and the first and second device isolation films 112 and 114. Thereafter, the first and second gate dielectric films 152 and 154 and the first and second gate lines 162 and 164 may be sequentially formed in the plurality of gate spacers defined by the plurality of insulating spacers.

According to the method of manufacturing the integrated circuit device 100 described with reference to FIGS. 8A through 8D above, fin-shaped active areas having different respective shapes may be formed in the first area I and the second area II, thereby relatively easily controlling a leakage current in highly scaled FETs, improving performance of the FETs, and relatively easily implementing multi-gate transistors performing different functions in the first area I and the second area II.

Although the method of manufacturing the integrated circuit device 100 is described with reference to FIGS. 8A through 8D above, the present inventive entity appreciates that the integrated circuit device 200 illustrated in FIG. 4, the integrated circuit device 300 illustrated in FIG. 5, or various integrated circuit devices modified or changed from the integrated circuit devices 200 and 300 may be relatively easily manufactured through various modifications and changes within the scope of present inventive concepts.

Figure 9:
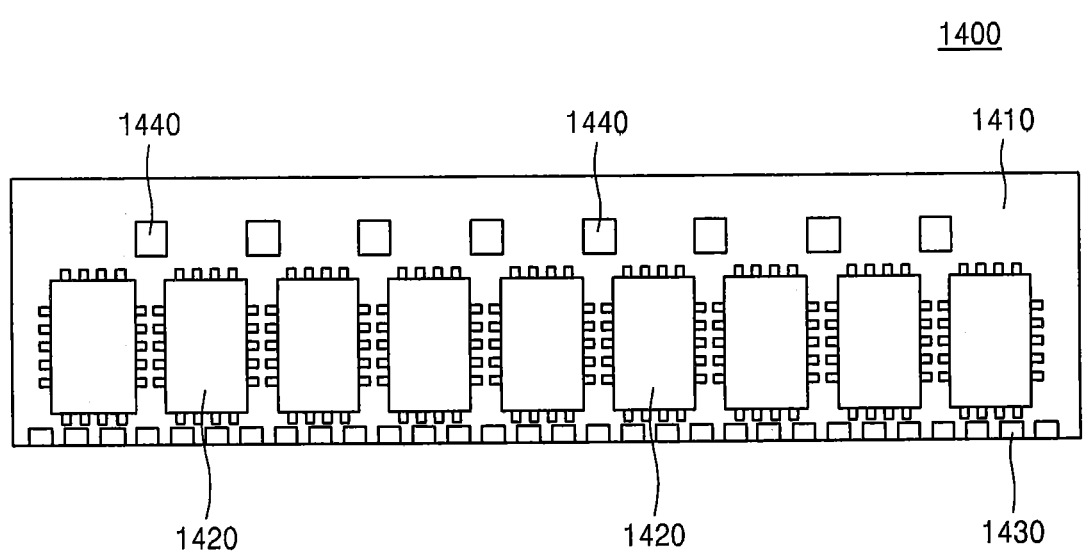
FIG. 9 is a plan view of a memory module according to some example embodiments of present inventive concepts.

FIG. 9 is a plan view of a memory module 1400 according to example embodiments of present inventive concepts.

The memory module 1400 may include a module substrate 1410 and a plurality of semiconductor chips 1420 attached to the module substrate 1410.

The semiconductor chips 1420 may include an integrated circuit device according to present inventive concepts. The semiconductor chips 1420 may include at least one of the integrated circuit devices 100, 200, and 300 according to example embodiments of present inventive concepts described with reference to FIGS. 1 through 7C, an integrated circuit device including the logic device 400 and/or the memory device 500, or integrated circuit devices modified or changed from the integrated circuit devices 100, 200, and 300 and the integrated circuit device including the logic device 400 and/or the memory device 500.

A connection unit 1430 that may be inserted into a socket of a mother board may be disposed at one side of the module substrate 1410. A ceramic decoupling capacitor 1440 may be disposed on the module substrate 1410. The memory module 1400 according to present inventive concepts is not limited to the example illustrated in FIG. 9 but may be manufactured in various forms.

Figure 10:
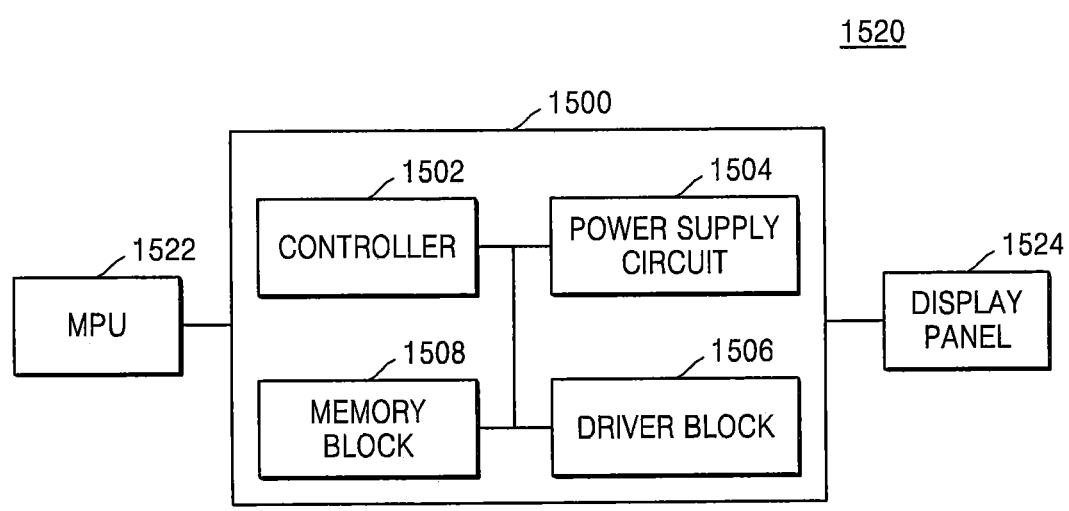
FIG. 10 is a schematic block diagram illustrating a display driver IC (DDI) and a display apparatus including the DDI according to some example embodiments of present inventive concepts.

FIG. 10 is a schematic block diagram illustrating a display driver IC (DDI) 1500 and a display apparatus 1520 including the DDI 1500 according to example embodiments of present inventive concepts.

Referring to FIG. 10, the DDI 1500 may include a controller 1502, a power supply circuit 1504, a driver block 1506, and a memory block 1508. The controller 1502 may receive and decode a command applied from a main processing unit (MPU) 1522, and control each block of the DDI 1500 to perform an operation according to the command. The power supply circuit unit 1504 may generate a driving voltage in response to the control of the controller 1502. The driver block 1506 may drive a display panel 1524 by using the driving voltage generated by the power supply circuit 1504 in response to the control of the controller 1502. The display panel 1524 may be a liquid crystal display panel, a plasma display panel, or an organic light emitting diode (OLED) panel. The memory block 1508 may be a block that temporarily stores the command input to the controller 1502 or control signals output from the controller 1502 or stores various/necessary data, and may include a memory such as RAM or ROM. At least one of the power supply circuit 1504 and the driver block 1506 may include at least one of the integrated circuit devices 100, 200, and 300 according to example embodiments of present inventive concepts described with reference to FIGS. 1 through 7C, an integrated circuit device including the logic device 400 and/or the memory device 500, or integrated circuit devices modified or changed from the integrated circuit devices 100, 200, and 300 and the integrated circuit device including the logic device 400 and/or the memory device 500.

Figure 11:
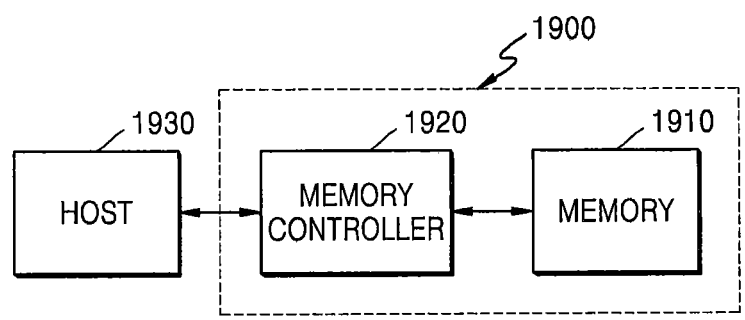
FIG. 11 is a block diagram illustrating an electronic system according to some example embodiments of present inventive concepts.

FIG. 11 is a block diagram illustrating an electronic system 1900 according to example embodiments of present inventive concepts.

The electronic system 1900 may include a memory 1910 and a memory controller 1920. The memory controller 1920 may control the memory 1910 to read and/or write data from or to the memory 1910 in response to a request of a host 1930. At least one of the memory 1910 and the memory controller 1920 may include at least one of the integrated circuit devices 100, 200, and 300 according to example embodiments of present inventive concepts described with reference to FIGS. 1 through 7C, an integrated circuit device including the logic device 400 and/or the memory device 500, or integrated circuit devices modified or changed from the integrated circuit devices 100, 200, and 300 and the integrated circuit device including the logic device 400 and/or the memory device 500.

Figure 12:
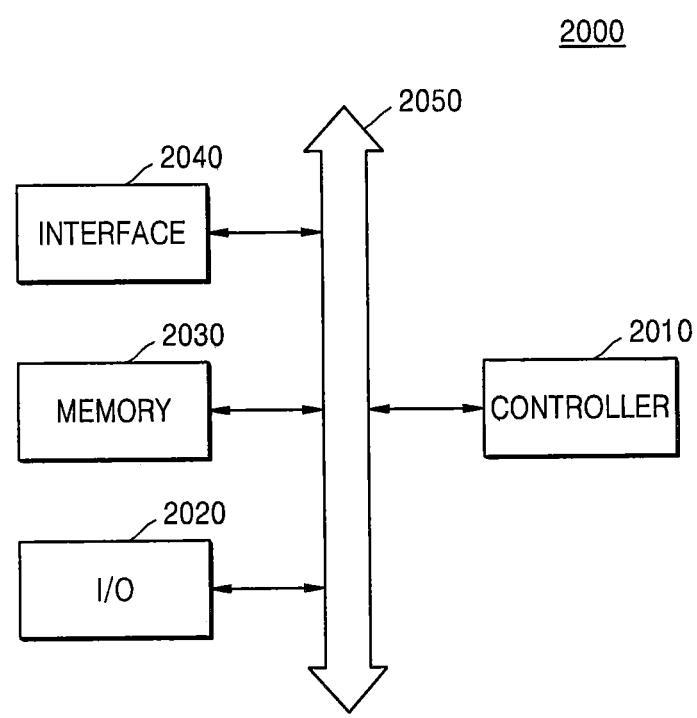
FIG. 12 is a block diagram illustrating an electronic system according to some example embodiments of present inventive concepts.

FIG. 12 is a block diagram illustrating an electronic system 2000 according to example embodiments of present inventive concepts.

The electronic system 2000 may include a controller 2010, an input/output (I/O) device 2020, a memory 2030, and an interface 2040, which are connected to one another via a bus 2050.

The controller 2010 may include at least one of a microprocessor, a digital signal processor, and processors similar to the microprocessor and the digital signal processor. The I/O device 2020 may include at least one of a keypad, a keyboard, and a display. The memory 2030 may be used in storing a command executed by the controller 2010. For example, the memory 2030 may be used to store user data.

The electronic system 2000 may be configured as a wireless communication apparatus or an apparatus capable of transmitting and/or receiving information in a wireless communication environment. For the electronic system 2000 to transmit or receive data over a wireless communication network, the interface 2040 may be a wireless interface. The interface 2040 may include an antenna and/or a wireless transceiver. In some embodiments, the electronic system 2000 may be used in a communication interface protocol of a $3^{rd}$ generation communication system such as a code division multiple access (CDMA), global system for mobile communications (GSM), North American digital cellular (NADC), extended-time division multiple access E-TDMA, and/or wide band code division multiple access (WCDMA). The electronic system 2000 may include at least one of the integrated circuit devices 100, 200, and 300 according to example embodiments of present inventive concepts described with reference to FIGS. 1 through 7C, an integrated circuit device including the logic device 400 and/or the memory device 500, or integrated circuit devices modified or changed from the integrated circuit devices 100, 200, and 300 and the integrated circuit device including the logic device 400 and/or the memory device 500.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   a substrate comprising a non-memory area and a memory area;
   a first fin-shaped active area in the non-memory area and comprising a first base portion protruding from the substrate in a first direction and a first top portion protruding from the first base portion in the first direction with a first inclination transition point between the first base portion and the first top portion, the first top portion having a first top width narrower than a first base width of the first base portion; and
   a second fin-shaped active area in the memory area and comprising a second base portion protruding from the substrate in the first direction and a second top portion protruding from the second base portion in the first direction with a second inclination transition point between the second base portion and the second top portion, the second top portion having a second top width narrower than a second base width of the second base portion, wherein the second top width is narrower than the first top width, wherein the first top portion protrudes a first distance from the first inclination transition point in the first direction, and wherein the second top portion protrudes a second distance from the second inclination transition point in the first direction, the second distance being greater than the first distance, such that the second fin-shaped active area in the memory area is narrower and taller than the first fin-shaped active area in the non-memory area.

2. The integrated circuit device of claim 1, wherein a first length from the substrate to the first inclination transition point in the first direction is substantially equal to a second length from the substrate to the second inclination transition point in the first direction.

3. The integrated circuit device of claim 1, wherein the first base portion has a first base side wall extending at a first base inclination angle with respect to the first direction, and wherein the first top portion has a first top side wall extending at a first top inclination angle with respect to the first direction with the first inclination transition point between the first base side wall and the first top side wall, the first top inclination angle being larger than zero degrees and different from the first base inclination angle.

4. The integrated circuit device of claim 3, wherein the first top inclination angle is larger than the first base inclination angle.

5. The integrated circuit device of claim 1, wherein the second base portion has a second base side wall extending at a second base inclination angle with respect to the first direction, and wherein the second top portion has a second top side wall extending at a second top inclination angle with respect to the first direction with the second inclination transition point between the second base side wall and the second top side wall, the second top inclination angle being different from the second base inclination angle.

6. The integrated circuit device of claim 5, wherein the second top inclination angle is larger than the second base inclination angle.

7. The integrated circuit device of claim 2, wherein the first base width of the first base portion and the second base width of the second base portion are substantially equal.

8. The integrated circuit device of claim 2, further comprising:

a first device isolation film on the first base portion; and
a second device isolation film on the second base portion, wherein a first top surface of the first device isolation film is substantially coplanar with a second top surface of the second device isolation film, wherein the first top portion protrudes from a first interface between a side wall of the first fin-shaped active area and the first top surface of the first device isolation film in the first direction, and wherein the second top portion protrudes from a second interface between a side wall of the second fin-shaped active area and the second top surface of the second device isolation film in the first direction.

9. An integrated circuit device comprising:

a substrate comprising a non-memory area and a memory area;

a first fin-shaped active area protruding from the substrate in the non-memory area; and a second fin-shaped active area protruding from the substrate in the memory area, wherein the first fin-shaped active area has a first base portion, a first top portion, and a first inclination transition point between the first base portion and the first top portion, a slope of a first side wall of the first fin-shaped active area being changed at the first inclination transition point, the first top portion protruding a first distance from the first inclination transition point in a first direction that is perpendicular to the substrate, wherein the first top portion has a first top side wall extending at a first top inclination angle with respect to the first direction from the first inclination transition point, wherein the integrated circuit device further comprises a gate that is on the first top side wall, wherein the first top inclination angle is larger than zero degrees, and wherein the second fin-shaped active area has a second base portion, a second top portion, and a second inclination transition point between the second base portion and the second top portion, a slope of a second side wall of the second fin-shaped active area being changed at the second inclination transition point, the second top portion protruding a second distance from the second inclination transition point in the first direction, the second distance being greater than the first distance.

10. The integrated circuit device of claim 9, wherein a first length from the substrate to the first inclination transition point in the first direction is substantially equal to a second length from the substrate to the second inclination transition point in the first direction.

11. The integrated circuit device of claim 10, wherein the first top portion has a first upper inclination transition point at a first level of the first top portion, the first level being between a level of the first inclination transition point and a level of the first distance from the first inclination transition point, a slope of the first top side wall of the first top portion being changed at the first upper inclination transition point, wherein the second top portion has a second upper inclination transition point at a second level of the second top portion, the second level being between a level of the second inclination transition point and a level of the second distance from the second inclination transition point, a slope of a second top side wall of the second top portion being changed at the second upper inclination transition point, and wherein the first top portion has a first width at the first level, and the second top portion has a second width at the second level, the second width being narrower than the first width, such that the second fin-shaped active area in the memory area is narrower and taller than the first fin-shaped active area in the non-memory area.

12. The integrated circuit device of claim 10, wherein the first inclination transition point is at substantially the same level as the second inclination transition point.

13. The integrated circuit device of claim 10, further comprising:

a first device isolation film having a first top surface extending to the first inclination transition point; and a second device isolation film having a second top surface extending to the second inclination transition point, the second top surface being substantially coplanar with the first top surface.

14. The integrated circuit device of claim 10, wherein the second top portion has a second top side wall extending at a second top inclination angle with respect to the first direction from the second inclination transition point, the second top inclination angle being greater than the first top inclination angle.

15. An integrated circuit device comprising:
a substrate comprising a non-memory area and a memory area;
a plurality of first fin-shaped active areas extending in parallel to each other in the non-memory area;
a plurality of second fin-shaped active areas extending in parallel to each other in the memory area;
a first device isolation film on a first lower side wall of each of the plurality of first fin-shaped active areas and having a first top surface; and
a second device isolation film on a second lower side wall of each of the plurality of second fin-shaped active areas and having a second top surface substantially coplanar with the first top surface,
wherein each of the plurality of first fin-shaped active areas has a first top portion protruding a first distance from a first interface between a first side wall of each of the plurality of first fin-shaped active areas and the first top surface of the first device isolation film in a first direction that is perpendicular to the substrate,
wherein the first top portion has a first upper inclination transition point at a first level of the first top portion, the first level being between a level of the first interface and a level of the first distance from the first interface, a slope of a side wall of the first top portion being changed at the first upper inclination transition point, and
wherein each of the plurality of second fin-shaped active areas has a second top portion protruding a second distance from a second interface between a second side wall of each of the plurality of second fin-shaped active areas and the second top surface of, the second device isolation film in the first direction, the second distance being greater than the first distance.

16. The integrated circuit device of claim 15, wherein each of the plurality of first fin-shaped active areas has a first lower inclination transition point, a slope of the first side wall of each of the plurality of first fin-shaped active areas being changed at the first lower inclination transition point,
wherein each of the plurality of second fin-shaped active areas has a second lower inclination transition point, a slope of the second side wall of each of the plurality of second fin-shaped active areas being changed at the second lower inclination transition point,
wherein the first top portion protrudes a third distance from the first lower inclination transition point in the first direction, and
wherein the second top portion protrudes a fourth distance from the second lower inclination transition point in the first direction, the fourth distance being greater than the third distance.

17. The integrated circuit device of claim 15, wherein the second top portion has a second upper inclination transition point at a second level of the second top portion, the second level being between a level of the second interface and a level of the second distance from the second interface, a slope of a side wall of the second top portion being changed at the second upper inclination transition point, and
wherein the first top portion has a first width at the first level, and the second top portion has a second width at the second level, the second width being narrower than the first width.

18. The integrated circuit device of claim 15, wherein spaced distances between the plurality of second fin-shaped active areas are greater than spaced distances between the plurality of first fin-shaped active areas.

19. The integrated circuit device of claim 1, wherein the first fin-shaped active area in the non-memory area and the second fin-shaped active area in the memory area comprise respective NMOS transistor bodies or respective PMOS transistor bodies, and
wherein a fin height of the second fin-shaped active area in the memory area is at least four times the second base width of the second base portion.

* * * * *